(12) United States Patent
Toda

(10) Patent No.: US 11,961,858 B2
(45) Date of Patent: Apr. 16, 2024

(54) SOLID-STATE IMAGING ELEMENT, ELECTRONIC DEVICE, AND METHOD OF MANUFACTURING ELECTRONIC DEVICE

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 886 days.

(21) Appl. No.: 16/964,864

(22) PCT Filed: Nov. 14, 2018

(86) PCT No.: PCT/JP2018/042049
§ 371 (c)(1),
(2) Date: Jul. 24, 2020

(87) PCT Pub. No.: WO2019/155709
PCT Pub. Date: Aug. 15, 2019

(65) Prior Publication Data
US 2021/0066373 A1 Mar. 4, 2021

(30) Foreign Application Priority Data
Feb. 9, 2018 (JP) ................................ 2018-021922

(51) Int. Cl.
*H01L 27/146* (2006.01)
*G02B 5/00* (2006.01)
(Continued)

(52) U.S. Cl.
CPC ........ *H01L 27/14618* (2013.01); *G02B 5/008* (2013.01); *G02B 5/284* (2013.01);
(Continued)

(58) Field of Classification Search
CPC ........... H01L 27/14618; H01L 27/1462; H01L 27/14623; H01L 27/14625;
(Continued)

(56) References Cited

U.S. PATENT DOCUMENTS

2006/0209413 A1* 9/2006 Kim ......................... G01J 3/26
359/577
2008/0251873 A1 10/2008 Kasano et al.
(Continued)

FOREIGN PATENT DOCUMENTS

CN 101728408 A 6/2010
CN 101884537 A 11/2010
(Continued)

OTHER PUBLICATIONS

International Search Report and Written Opinion of PCT Application No. PCT/JP2018/042049, dated Feb. 5, 2019, 13 pages of ISRWO.

*Primary Examiner* — Christopher K Peterson
(74) *Attorney, Agent, or Firm* — CHIP LAW GROUP

(57) ABSTRACT

A ripple is suppressed in a solid-state imaging element that obtains a spectral spectrum. The solid-state imaging element includes a surface layer, a filter layer, and a photoelectric conversion layer. In the solid-state imaging element, the surface layer has a thickness exceeding a half of a coherence length of incident light. Furthermore, in the solid-state imaging element, the filter layer transmits predetermined target light of the incident light transmitted through the surface layer and reflects a rest of the incident light transmitted through the surface layer to the surface layer. Furthermore, in the solid-state imaging element, the photoelectric conversion layer photoelectrically converts the predetermined target light transmitted through the filter layer.

9 Claims, 31 Drawing Sheets

(51) Int. Cl.
    *G02B 5/28*     (2006.01)
    *G06T 7/00*     (2017.01)
    *G06V 10/143*     (2022.01)
    *G06V 10/147*     (2022.01)
    *G06V 20/10*     (2022.01)
    *H04N 25/70*     (2023.01)

(52) U.S. Cl.
    CPC .......... *G06T 7/0012* (2013.01); *G06V 10/143* (2022.01); *G06V 10/147* (2022.01); *H01L 27/1462* (2013.01); *H01L 27/14623* (2013.01); *H01L 27/14625* (2013.01); *H01L 27/14636* (2013.01); *H01L 27/14645* (2013.01); *H01L 27/14683* (2013.01); *H04N 25/70* (2023.01); *G06T 2207/10032* (2013.01); *G06T 2207/30188* (2013.01); *G06V 20/188* (2022.01)

(58) Field of Classification Search
    CPC ......... H01L 27/14636; H01L 27/14645; H01L 27/14683; H01L 27/1464; H01L 27/14685; G02B 5/008; G02B 5/284; G02B 1/11; G02B 5/26; G06T 7/0012; G06V 10/143; G06V 10/147; G06V 20/188; G06V 2201/03; H04N 25/70
    See application file for complete search history.

(56) References Cited

U.S. PATENT DOCUMENTS

| | | |
|---|---|---|
| 2010/0109006 A1 | 5/2010 | Kobayashi et al. |
| 2010/0292578 A1* | 11/2010 | Sato ................. A61B 5/489 600/473 |
| 2011/0008602 A1* | 1/2011 | Peeters ............. C23C 16/006 427/164 |
| 2011/0062314 A1 | 3/2011 | Doege |
| 2013/0134540 A1 | 5/2013 | Maeda et al. |
| 2013/0240708 A1 | 9/2013 | Kokubun |
| 2014/0146207 A1* | 5/2014 | Yokogawa ........ H01L 27/14621 257/432 |
| 2014/0159702 A1 | 6/2014 | Doege |
| 2014/0210032 A1 | 7/2014 | Maeda et al. |
| 2017/0053963 A1 | 2/2017 | Doege |
| 2017/0223947 A1* | 8/2017 | Gall ..................... A01B 79/005 |
| 2017/0278826 A1 | 9/2017 | Sugizaki et al. |
| 2017/0278889 A1* | 9/2017 | Nakashikiryo ... H01L 27/14627 |
| 2017/0338267 A1* | 11/2017 | Notsu .................. H04N 23/55 |

FOREIGN PATENT DOCUMENTS

| | | |
|---|---|---|
| CN | 103098213 A | 5/2013 |
| CN | 106537906 A | 3/2017 |
| CN | 107078138 A | 8/2017 |
| CN | 107425023 A | 12/2017 |
| CN | 107425024 A | 12/2017 |
| DE | 102007036973 A1 | 9/2008 |
| EP | 1962493 A2 | 8/2008 |
| EP | 2595189 A1 | 5/2013 |
| EP | 3232472 A2 | 10/2017 |
| ES | 2631903 T3 | 9/2017 |
| JP | 2005-252183 A | 9/2005 |
| JP | 2008-177362 A | 7/2008 |
| JP | 2008-300788 A | 12/2008 |
| JP | 2010-109137 A | 5/2010 |
| JP | 2010-519825 A | 6/2010 |
| JP | 2010-267086 A | 11/2010 |
| JP | 2011-238658 A | 11/2011 |
| JP | 2012-023251 A | 2/2012 |
| JP | 2013-191717 A | 9/2013 |
| KR | 10-2010-0038284 A | 4/2010 |
| KR | 10-2010-0048890 A | 5/2010 |
| KR | 10-2011-0119838 A | 11/2011 |
| KR | 10-2011-0119839 A | 11/2011 |
| KR | 10-2013-0090396 A | 8/2013 |
| KR | 10-2018-0026805 A | 3/2018 |
| TW | 201027731 A | 7/2010 |
| TW | 201214687 A | 4/2012 |
| WO | 2008/102005 A2 | 8/2008 |
| WO | 2012/008387 A1 | 1/2012 |
| WO | 2016/009925 A1 | 1/2016 |
| WO | 2016/056396 A1 | 4/2016 |

\* cited by examiner

FIG. 6

| RELATIVE COORDINATE IN PIXEL BLOCK | DIAMETER D | PERIOD P |
|---|---|---|
| (0, 0) | D0 | P0 |
| (0, 1) | D1 | |
| (0, 2) | D2 | |
| (0, 3) | D3 | |
| (1, 0) | D0 | P1 |
| (1, 1) | D1 | |
| (1, 2) | D2 | |
| (1, 3) | D3 | |
| (2, 0) | D0 | P2 |
| (2, 1) | D1 | |
| (2, 2) | D2 | |
| (2, 3) | D3 | |
| (3, 0) | D0 | P3 |
| (3, 1) | D1 | |
| (3, 2) | D2 | |
| (3, 3) | D3 | |

SOLID-STATE IMAGING ELEMENT, ELECTRONIC DEVICE, AND METHOD OF MANUFACTURING ELECTRONIC DEVICE

CROSS REFERENCE TO RELATED APPLICATIONS

This application is a U.S. National Phase of International Patent Application No. PCT/JP2018/042049 filed on Nov. 14, 2018, which claims priority benefit of Japanese Patent Application No. JP 2018-021922 filed in the Japan Patent Office on Feb. 9, 2018. Each of the above-referenced applications is hereby incorporated herein by reference in its entirety.

TECHNICAL FIELD

The present technology relates to a solid-state imaging element, an electronic device, and a method of manufacturing the electronic device. More specifically, the present technology relates to a solid-state imaging element that performs dispersion of light using an optical filter, an electronic device, and a method of manufacturing the electronic device.

BACKGROUND ART

Conventionally, an optical filter that allows a desired wavelength to pass is used when light is decomposed (that is, dispersed) into a plurality of colors. For example, a solid-state imaging element in which an organic photoelectric conversion layer, a color filter, and an inorganic photoelectric conversion layer are arranged has been proposed (for example, see Patent Document 1). In this solid-state imaging element, the organic photoelectric conversion layer photoelectrically converts incident light to generate received light data of a certain wavelength. The color filter transmits light of a desired wavelength in light transmitted through the organic photoelectric conversion layer, and the inorganic photoelectric conversion layer photoelectrically converts the transmitted light to generate received light data having a wavelength different from that of the organic photoelectric conversion layer. Then, a spectral spectrum, which is a distribution of intensity (spectrum) for every wavelength, is obtained from those received light data. In this spectral spectrum, a locus of the spectrum may be wavy (in other words, vibrate), and the vibration is called a ripple.

CITATION LIST

Patent Document

Patent Document 1: Japanese Patent Application Laid-Open No. 2011-238658

SUMMARY OF THE INVENTION

Problems to be Solved by the Invention

In the conventional technology described above, various processing such as biometric authentication, a vegetation survey, or the like can be performed by analyzing the spectral spectrum. However, in the configuration described above, there is a possibility that the ripple will become large due to interference between light reflected by a light receiving surface of the solid-state imaging element and light reflected by the color filter. When the ripple is large, accuracy is decreased in the processing such as the biometric authentication or the like, and it is thus preferable to suppress the ripple.

The present technology has been made in view of such a situation, and an object of the present technology is to suppress a ripple in a solid-state imaging element that obtains a spectral spectrum.

Solutions to Problems

The present technology has been made in order to solve the problems described above, and a first aspect of the present technology is a solid-state imaging element including: a surface layer that has a thickness exceeding a half of a coherence length of incident light; a filter layer that transmits predetermined target light of the incident light transmitted through the surface layer and reflects a rest of the incident light transmitted through the surface layer to the surface layer; and a photoelectric conversion layer that photoelectrically converts the predetermined target light transmitted through the filter layer. This brings about an action that an optical path difference between reflected light reflected by a light receiving surface of the surface layer and reflected light reflected by an interface between the surface layer and the filter layer becomes less than the coherence length.

Furthermore, in the first aspect, the surface layer may include an antireflection film. This brings about an action that a reflectance of the surface layer is reduced.

Furthermore, in the first aspect, the surface layer may further include a silicon dioxide layer. This brings about an action that an optical path difference between reflected light reflected by a light receiving surface of the silicon dioxide layer and reflected light reflected by an interface between the silicon dioxide layer and the filter layer becomes less than the coherence length.

Furthermore, in the first aspect, the surface layer may further include a transparent resin layer. This brings about an action that warpage of a silicon wafer is suppressed.

Furthermore, in the first aspect, the surface layer may further include a stress relaxation resin layer. This brings about an action that peeling-off of the transparent resin layer is prevented.

Furthermore, in the first aspect, the filter layer may include a surface plasmon resonance filter. This brings about an action that light of a desired wavelength is transmitted through the filter layer.

Furthermore, in the first aspect, the filter layer may include a Fabry-Perot resonator. This brings about an action that light of a desired wavelength is transmitted through the filter layer.

Furthermore, in the first aspect, the incident light can include natural light, and the thickness of the surface layer cannot be less than 2.0 micrometers. This brings about an action that a ripple is reduced.

Furthermore, a second aspect of the present technology is an electronic device including: a surface layer that has a thickness exceeding a half of a coherence length of incident light; a filter layer that transmits predetermined target light of the incident light transmitted through the surface layer and reflects a rest of the incident light transmitted through the surface layer to the surface layer; a photoelectric conversion layer that photoelectrically converts the predetermined target light transmitted through the filter layer to generate a pixel signal; and a signal processing unit that executes predetermined signal processing for the pixel signal, and a method of manufacturing the electronic device. This brings about an action that a spectral spectrum with a reduced ripple is obtained.

Furthermore, in the second aspect, the electronic device may further include a cover glass, in which the incident light is incident on the surface layer via the cover glass and a predetermined gas. This brings about an action that dispersion of light is performed in a solid-state imaging element without an on-chip lens.

Furthermore, in the second aspect, a normalized difference vegetation index may be obtained in the signal processing. This brings about an action that vegetation is surveyed.

Furthermore, in the second aspect, the signal processing unit can perform biometric authentication in the signal processing. This brings about an action that security is improved.

Effects of the Invention

According to the present technology, it is possible to accomplish an excellent effect that a ripple can be suppressed in a solid-state imaging element that obtains a spectral spectrum. Note that an effect described here is not necessarily limited, and may be any effect described in the present disclosure.

BRIEF DESCRIPTION OF DRAWINGS

FIG. 6 is a diagram illustrating an example of a diameter and a period for every pixel according to the first embodiment of the present technology.

MODE FOR CARRYING OUT THE INVENTION

Hereinafter, modes for carrying out the present technology (hereinafter, referred to as embodiments) will be described. A description will be given in the following order.

1. First embodiment (example in which a thickness of a surface layer is made larger than a half of a coherence length)

2. Second embodiment (example in which a thickness of a surface layer including a transparent resin is made larger than a half of a coherence length)

3. Third embodiment (example in which a thickness of a surface layer including a stress relaxation resin layer is made larger than a half of a coherence length)

4. Fourth embodiment (example in which a thickness of a surface layer is made larger than a half of a coherence length and a Fabry-Perot resonator is arranged below the surface layer)

5. Fifth embodiment (example in which a thickness of a surface layer is made larger than a half of a coherence length and a vegetation survey is performed)

6. Sixth embodiment (example in which a thickness of a surface layer is made larger than a half of a coherence length and biometric authentication is performed)

7. Application example to endoscopic surgery system

1. First Embodiment

Configuration Example of Electronic Device

Figure 1:
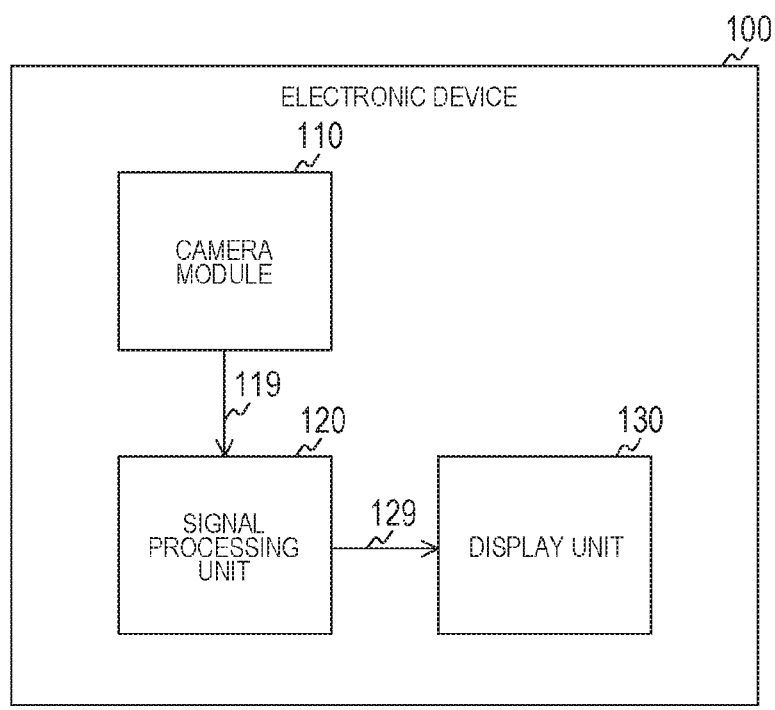
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 is a device for dispersing light, and includes a camera module 110, a signal processing unit 120, and a display unit 130. As the electronic device 100, a smartphone having a biometric authentication function, a camera mounted on a drone, or the like, is assumed.

The camera module 110 captures image data in synchronization with a vertical scanning signal or the like. The camera module 110 supplies the image data to the signal processing unit 120 via a signal line 119.

The signal processing unit 120 executes predetermined signal processing for the image data. This signal processing unit 120 obtains a spectral spectrum in the signal processing. The spectral spectrum is used for biometric authentication and the like. The signal processing unit 120 supplies a processing result to the display unit 130 via a signal line 129. The display unit 130 displays the processing result.

Configuration Example of Camera Module

Figure 2:
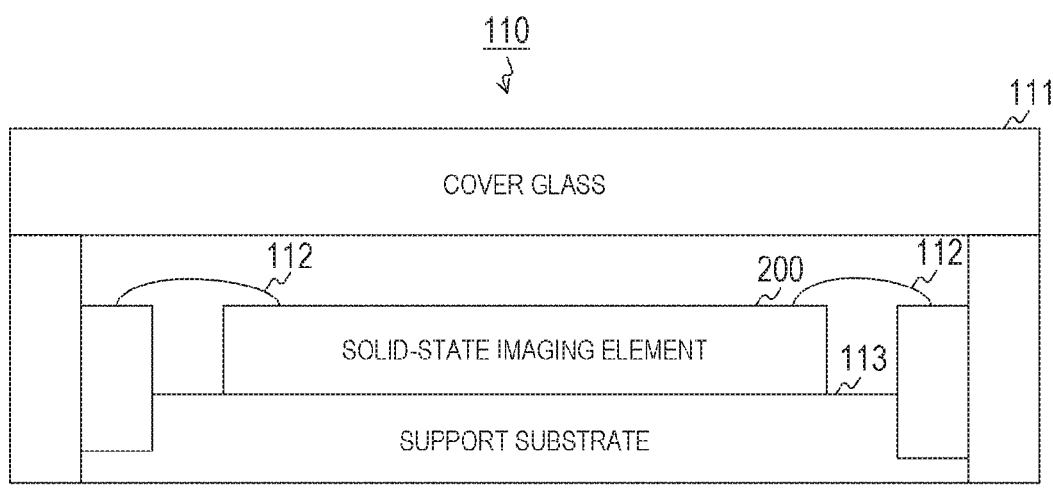
FIG. 2 is an example of a cross-sectional view of a camera module according to the first embodiment of the present technology.
Figure 2:
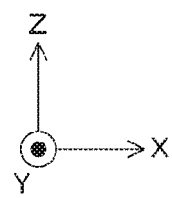

FIG. 2 is an example of a cross-sectional view of the camera module 110 according to the first embodiment of the present technology. The camera module 110 includes a cover glass 111, a solid-state imaging element 200, and a support substrate 113.

Here, a predetermined direction parallel to a light receiving surface of the cover glass 111 or the solid-state imaging element 200 is defined as an X direction, and a direction perpendicular to the light receiving surface is defined as a Z direction. Furthermore, a direction perpendicular to the X direction and the Z direction is defined as a Y direction. A cross-sectional view of FIG. 2 is a view viewed from the Y direction.

The cover glass 111 protects the light receiving surface of the solid-state imaging element 200. A predetermined gas such as air, a dry nitrogen gas, or the like is added between the cover glass 111 and the solid-state imaging element 200. Furthermore, the solid-state imaging element 200 is connected to the support substrate 113 via a wire 112.

Configuration Example of Solid-state Imaging Element

Figure 3:
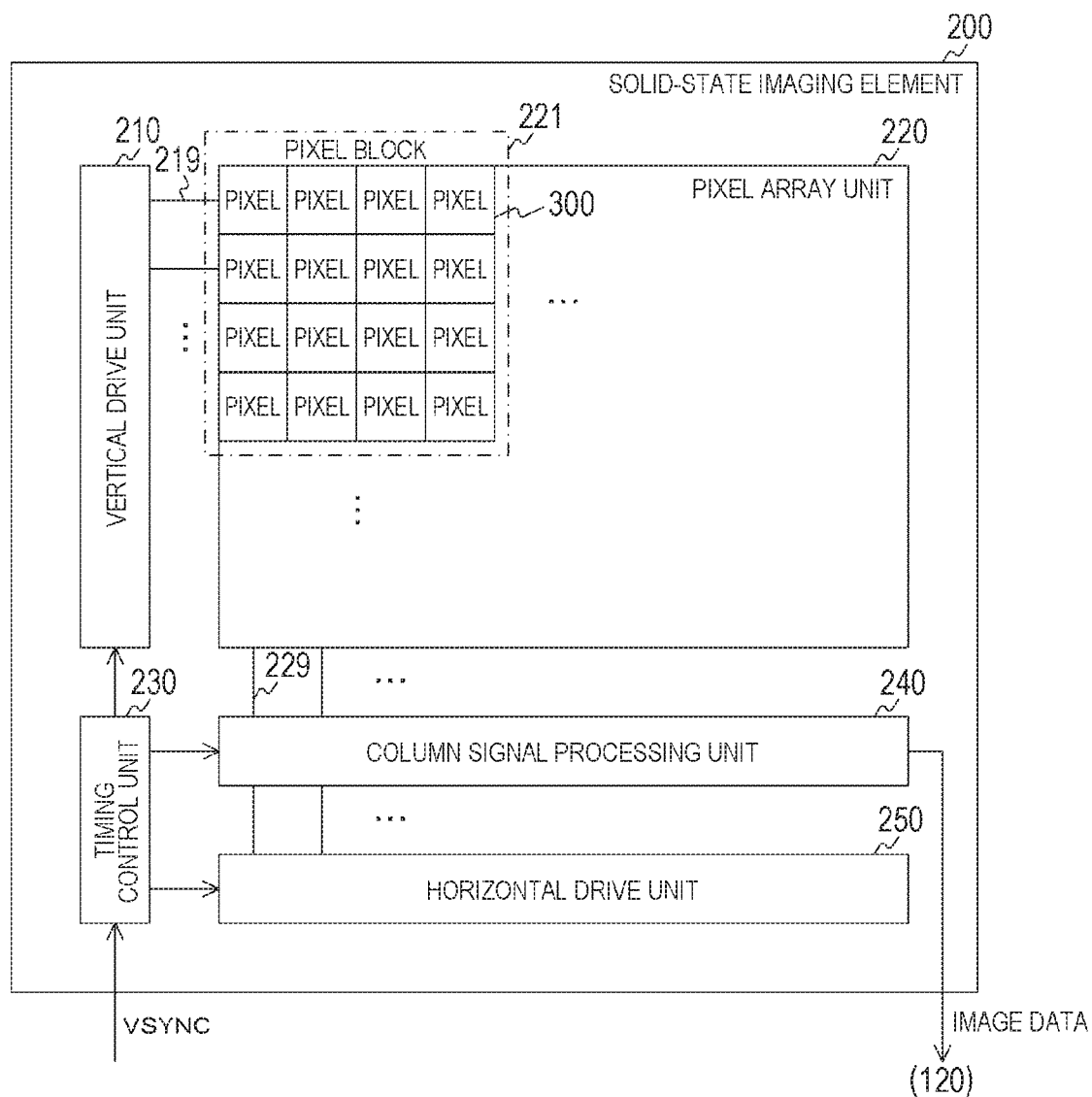
FIG. 3 is a block diagram illustrating a configuration example of a solid-state imaging element according to the first embodiment of the present technology.

FIG. 3 is a block diagram illustrating a configuration example of the solid-state imaging element 200 according to the first embodiment of the present technology. The solid-state imaging element 200 includes a vertical drive unit 210, a pixel array unit 220, a timing control unit 230, a column signal processing unit 240, and a horizontal drive unit 250.

In the pixel array unit 220, a plurality of pixels 300 is arranged in a two-dimensional grid pattern. Hereinafter, a set of pixels 300 arranged in a horizontal direction is referred to as a "row", and a set of pixels 300 arranged in a direction perpendicular to the row is referred to as a "column".

Furthermore, the pixel array unit 220 is divided into a plurality of pixel blocks 221 each of which includes a predetermined number of pixels 300. For example, each of the pixel blocks 221 includes sixteen pixels 300 arranged in 4 rows×4 columns. Each of the pixels 300 in the pixel block 221 receives light having a different wavelength, generates a pixel signal, and supplies the pixel signal to the column signal processing unit 240.

The timing control unit 230 controls an operation timing of each of the vertical drive unit 210, the column signal processing unit 240, and the horizontal drive unit 250 in synchronization with a vertical synchronization signal VSYNC. The vertical drive unit 210 sequentially drives the rows to cause pixel signals to be output.

The column signal processing unit 240 executes analog to digital (AD) conversion processing, correlated double sampling (CDS) processing, or the like, for every column for the pixel signals from the pixel array unit 220. The column signal processing unit 240 outputs the processed pixel signal to the signal processing unit 120 under the control of the vertical drive unit 210. The horizontal drive unit 250 sequentially selects the columns and outputs pixel signals of the selected columns.

Configuration Example of Pixel

Figure 4:
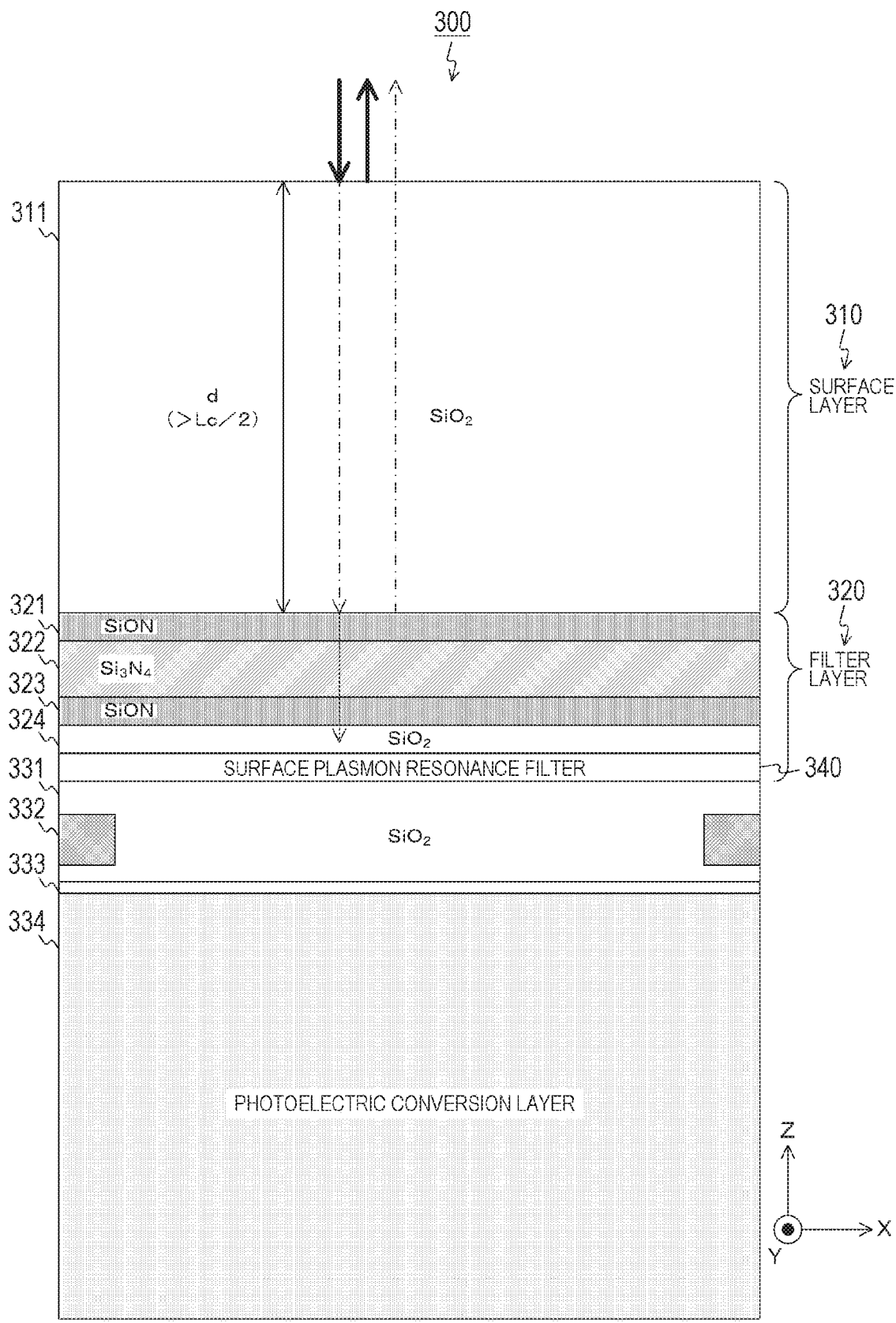
FIG. 4 is an example of a cross-sectional view of a pixel according to the first embodiment of the present technology.

FIG. 4 is an example of a cross-sectional view of the pixel 300 according to the first embodiment of the present technology. A surface layer 310 is arranged in an uppermost layer of the pixel 300 with a direction from the support substrate 113 to the cover glass 111 (in other words, a light receiving side) as an upward direction.

The surface layer 310 is a first layer on which light is incident via air having a refractive index of 1, and is provided in order to protect a surface of the solid-state imaging element 200. A refractive index of the surface layer 310 is larger than, for example, 1. For example, a silicon dioxide ($SiO_2$) layer 311 is used as the surface layer 310. Furthermore, a filter layer 320 is arranged below the surface layer 310.

Note that only the silicon dioxide layer 311 is arranged in the surface layer 310, but an antireflection film may be further arranged to form the surface layer 310 into a two-layer structure, as described later.

The filter layer 320 transmits a predetermined target light of the incident light transmitted through the surface layer 310 and reflects the rest of the incident light to the surface layer 310. The filter layer 320 includes a silicon oxynitride (SiON) layer 321, a silicon nitride ($Si_3N_4$) layer 322, a silicon oxynitride layer 323, a silicon dioxide layer 324, and a surface plasmon resonance filter 340 sequentially arranged from the top.

The silicon oxynitride layer 321, the silicon nitride layer 322, and the silicon oxynitride layer 323 have different refractive indexes, and a reflectance of the filter layer 320 can be adjusted by changing thicknesses of the silicon oxynitride layer 321, the silicon nitride layer 322, and the silicon oxynitride layer 323. Furthermore, the silicon nitride layer 322 functions as a passivation layer that prevents oxidation of aluminum used for the surface plasmon resonance filter 340.

The surface plasmon resonance filter 340 transmits light of a predetermined wavelength by using a surface plasmon resonance phenomenon in which surface plasmon and light resonate with each other. Here, the plasmon means a state where electrons inside metal fine particles are shaken and an electric field is changed due to light striking the metal fine particles, such that free electrons are biased, and the surface plasmon refers to plasmon generated on a metal surface. Details of a structure of the surface plasmon resonance filter 340 will be described later.

A silicon dioxide layer 331 is arranged below the filter layer 320. A light shielding film 332 is arranged near an outer periphery of the silicon dioxide layer 331. The light shielding film 332 shields light from adjacent pixels, and is provided in order to prevent color mixture.

An antireflection film 333 is arranged below the silicon dioxide layer 331, and a photoelectric conversion layer 334 is arranged below the antireflection film 333.

The photoelectric conversion layer 334 photoelectrically converts the target light transmitted through the filter layer 320 to generate a pixel signal. For example, a silicon substrate on which a pn junction photodiode is formed is used as the photoelectric conversion layer 334. A wiring layer is further arranged below the photoelectric conversion layer 334, but the wiring layer is omitted for convenience of description.

Here, a cause of a ripple will be described. Since a refractive index of air is different from that of the surface layer 310, when the incident light is incident on the surface layer 310, a part of the incident light is transmitted through and the rest of the incident light is reflected on a light receiving surface p1 of the surface layer 310. Thick solid lines in FIG. 4 indicate the incident light and reflected light r1 which is the reflected part of the incident light.

Furthermore, since the surface layer 310 and the filter layer 320 have different refractive indices, a part of the transmitted light transmitted through the light receiving surface p1 is transmitted through on an interface p2 between the surface layer 310 and the filter layer 320, and the rest of the transmitted light is reflected on the interface p2. Alternative long and short dash lines in FIG. 4 indicate the transmitted light transmitted through the light receiving surface p1 and reflected light r2 which is the reflected part of the transmitted light.

Interference is generated due to superposition between the reflected light r1 and the reflected light r2. At this time, a phase difference between the reflected light r1 and the reflected light r2 is determined by a difference between optical path lengths of the reflected light r1 and the reflected light r2 and the presence or absence of phase inversion due to reflection. In a case where the phase difference between the reflected light r1 and the reflected light r2 is an integral multiple of a wavelength, the reflected light r1 and the reflected light r2 strengthen each other, and in a case where the reflected light r1 and the reflected light r2 are deviated from each other by a half wavelength, the reflected light r1 and the reflected light r2 weaken each other. Due to this interference, a reflectance of the pixel 300 changes. Similarly, a transmittance also changes.

Furthermore, in the interference, a wavelength interval $\Delta\lambda$ when an m-th order (m is an integer) and an m+1-th order strengthen each other is expressed by the following equation.

$$\Delta\lambda = \lambda/(4n_1) \times (4\Delta n + \lambda/d) \quad \text{Equation 1}$$

In the above equation, $\lambda$ indicates a wavelength of incident light (natural light or the like), and a unit of $\lambda$ is, for example, a micrometer ($\mu m$). $n_1$ indicates the refractive index of the surface layer 310. $\Delta n$ is a difference in the refractive index with respect to a wavelength of the surface layer 310, and indicates a refractive index wavelength dispersion. d indicates a thickness of the surface layer 310, and a unit of d is, for example, a micrometer ($\mu m$).

From Equation 1, the larger the thickness d and the smaller the refractive index dispersion $\Delta n$, the shorter the wavelength interval $\Delta\lambda$ that represents a period of a vibration (ripple) of a spectrum. As described above, the ripple is generated by the interference between the reflected light r1 and the reflected light r2. Therefore, in order to reduce the ripple, the interference is only required to be weakened.

Here, an interference phenomenon occurs when 2d, which is an optical path difference between the reflected light r1 and the reflected light r2, is equal to or less than a coherence length. That is, interference occurs when the following equation is satisfied.

$$2d \leq Lc \quad \text{Equation 2}$$

In the above equation, Lc is a coherence length of the incident light and is represented by the following equation.

$$Lc \approx \lambda^2/\delta\lambda$$

In the above equation, $\delta\lambda$ is a spectrum half-value width, and a unit of $\delta\lambda$ is, for example, a micrometer ($\mu m$). In natural light, the coherence length Lc is about several micrometers ($\mu m$).

Therefore, from Equation 2, if the thickness d of the surface layer 310 is set to a value that satisfies the following equation, coherence can be lost. That is, the ripple can be reduced by making the thickness d of the surface layer 310 larger than a half of the coherence length Lc.

$$d > Lc/2 \quad \text{Equation 3}$$

Note that the ripple can be relaxed even with a configuration in which an on-chip micro-lens (OCL) is provided for every pixel 300, but this configuration is not preferable. When the OCL is provided, light vertically incident near the center of the lens is vertically incident on the surface layer 310 as it is, but the light incident on a position deviated from the center is incident in an oblique direction on the surface layer 310. At this time, an optical path length of the light incident in the oblique direction is changed with respect to the light that is vertically incident, and the ripple thus causes a wavelength shift. Therefore, since different lights are simultaneously incident on one photoelectric conversion layer 334, it seems that the ripple is relaxed by integration between the different lights, and an interference effect itself is not relaxed. Then, a demerit that a peak wavelength shifts to a long wavelength to change into a broad spectrum, due to the obliquely incident component, occurs.

On the other hand, the solid-state imaging element 200 has an OCL-less structure as illustrated in FIG. 2. Therefore, it becomes possible to narrow signal processing as compared with a case where the OCL is provided. Here, the term "OCL-less" means that the uppermost surface layer 310 does not have an OCL and is flat. Note that the term "flat"

means a state where a layer does not have an unevenness larger than a wavelength of light and can be regarded as being optically flat.

Configuration Example of Filter

Figure 5:
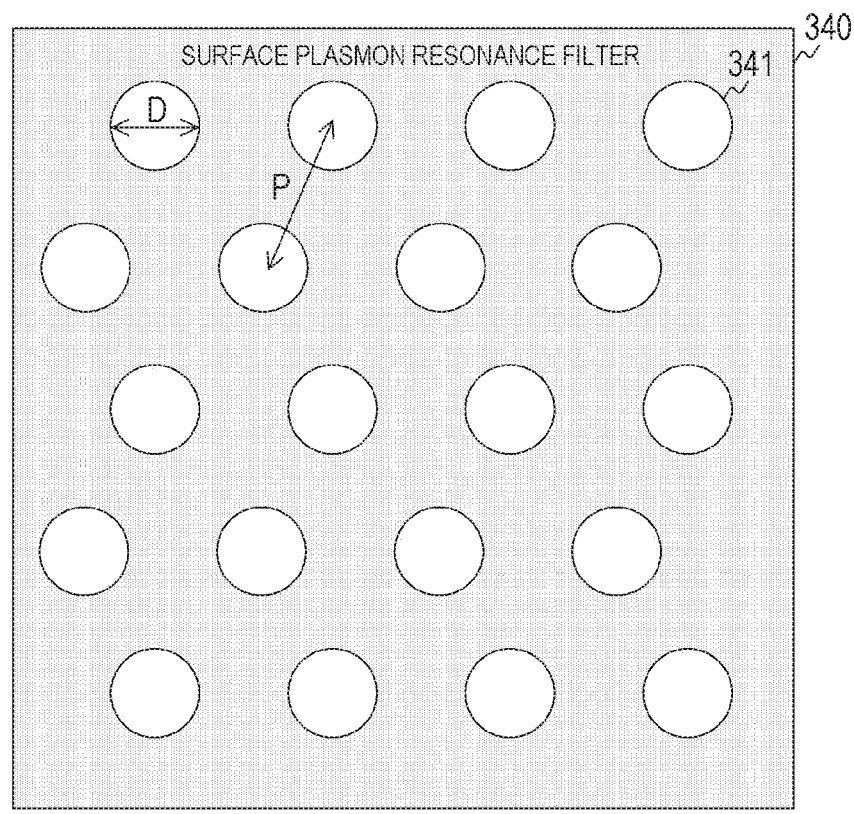
FIG. 5 is an example of a plan view of a surface plasmon resonance filter according to the first embodiment of the present technology.

FIG. 5 is an example of a plan view of the surface plasmon resonance filter 340 according to the first embodiment of the present technology. The surface plasmon resonance filter 340 is formed by forming a plurality of holes 341 at regular intervals in a thin film including aluminum (Al) or the like. An interval between adjacent holes 341 is called a "period". By changing a diameter D of the hole 341 and the period P between the holes 341, a transmission spectral spectrum and a peak wavelength of the transmission spectral spectrum can be adjusted. Note that a thin film including gold (Au) or silver (Ag) instead of aluminum can also be used. Furthermore, a dielectric such as an oxide film or the like may be arranged in an upper layer or a lower layer of the surface plasmon resonance filter 340 or in the hole 341.

FIG. 6 is a diagram illustrating an example of a diameter and a period for every pixel according to the first embodiment of the present technology. At least one of a diameter and a period of the surface plasmon resonance filter 340 of the pixel is different for every pixel 300 in the pixel block 221.

Since sixteen pixels 300 are arranged in 4 rows×4 columns in the pixel block 221, relative coordinates of the pixels 300 in the pixel block 221 are represented by (x, y) by, for example, setting x to "0" to "3" and setting y to "0" to "3".

For example, P0 is set to a period of the pixel 300 of x coordinate "0", and P1 is set to a period of the pixel 300 of x coordinate "1". Furthermore, P2 is set to a period of the pixel 300 of x coordinate "2", and P3 is set to a period of the pixel 300 of x coordinate "3". Then, D0 is set to a diameter of the pixel 300 of y coordinate "0", and D1 is set to a diameter of the pixel 300 of y coordinate "1". Furthermore, D2 is set to a diameter of the pixel 300 of y coordinate "2", and D3 is set to a diameter of the pixel 300 of y coordinate "3".

As described above, the incident light can be dispersed into sixteen wavelengths by setting sixteen combinations of diameters and periods for every pixel block 221. A spectral spectrum is obtained by plotting a signal level for every wavelength. This spectral spectrum can be used in various applications such as biometric authentication, a vegetation survey, or the like. When the ripple occurs in the spectral spectrum, there is a possibility that performance of an application will be deteriorated, but by setting the thickness d that satisfies Equation 3, the ripple can be reduced to suppress performance deterioration.

Note that the number of pixels in the pixel block 221 is not limited to 16, and may be, for example, 3×3=9 or 5×5=25. When the number of pixels in the pixel block 221 is n (n is an integer), it is possible to disperse light into n wavelength components.

In order to verify a ripple reduction effect, spectral sensitivity characteristics in a case where various thicknesses d were set were estimated using a three-dimensional finite-difference time-domain (FDTD) method.

Figure 7:
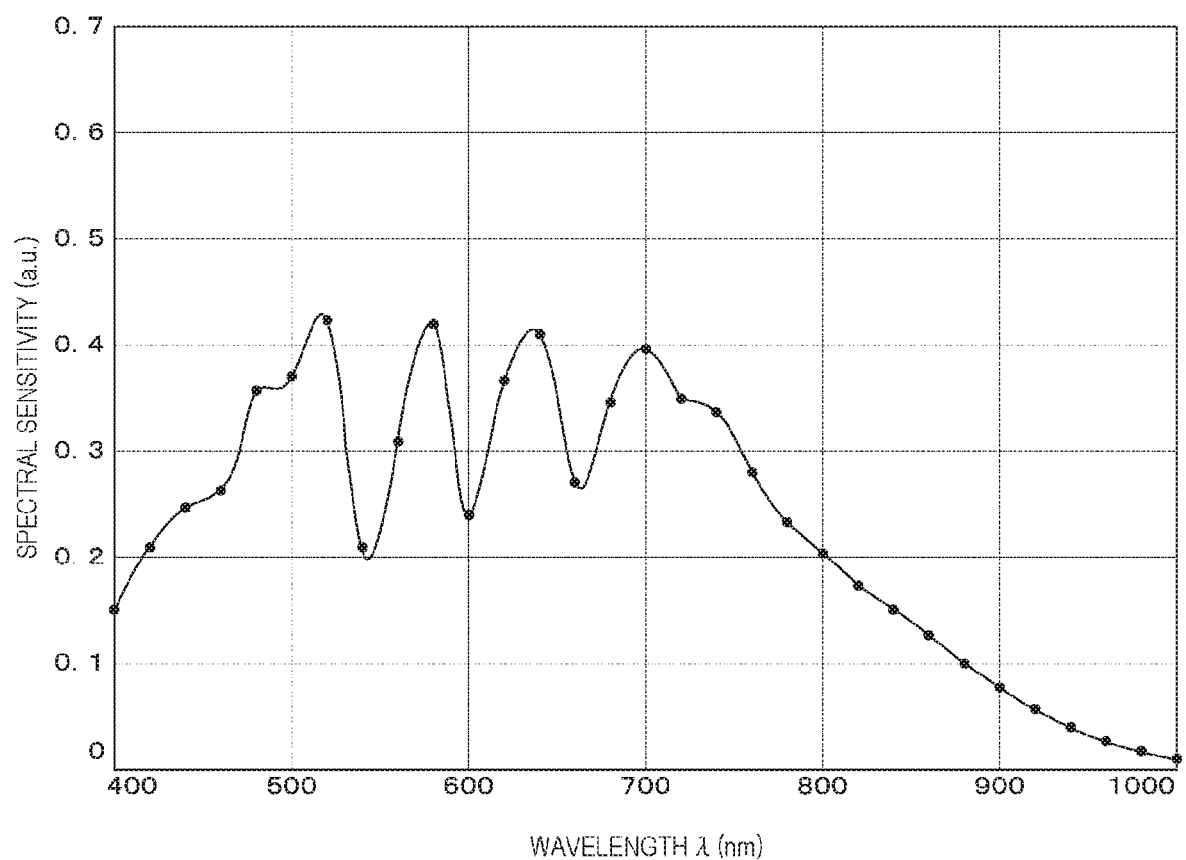
FIG. 7 is a graph illustrating an example of spectral sensitivity characteristics when a thickness was set to 0.1 micrometers (μm) according to a comparative example.

FIG. 7 is a graph illustrating an example of spectral sensitivity characteristics when the thickness d was set to 0.1 micrometers (μm).

Figure 8:
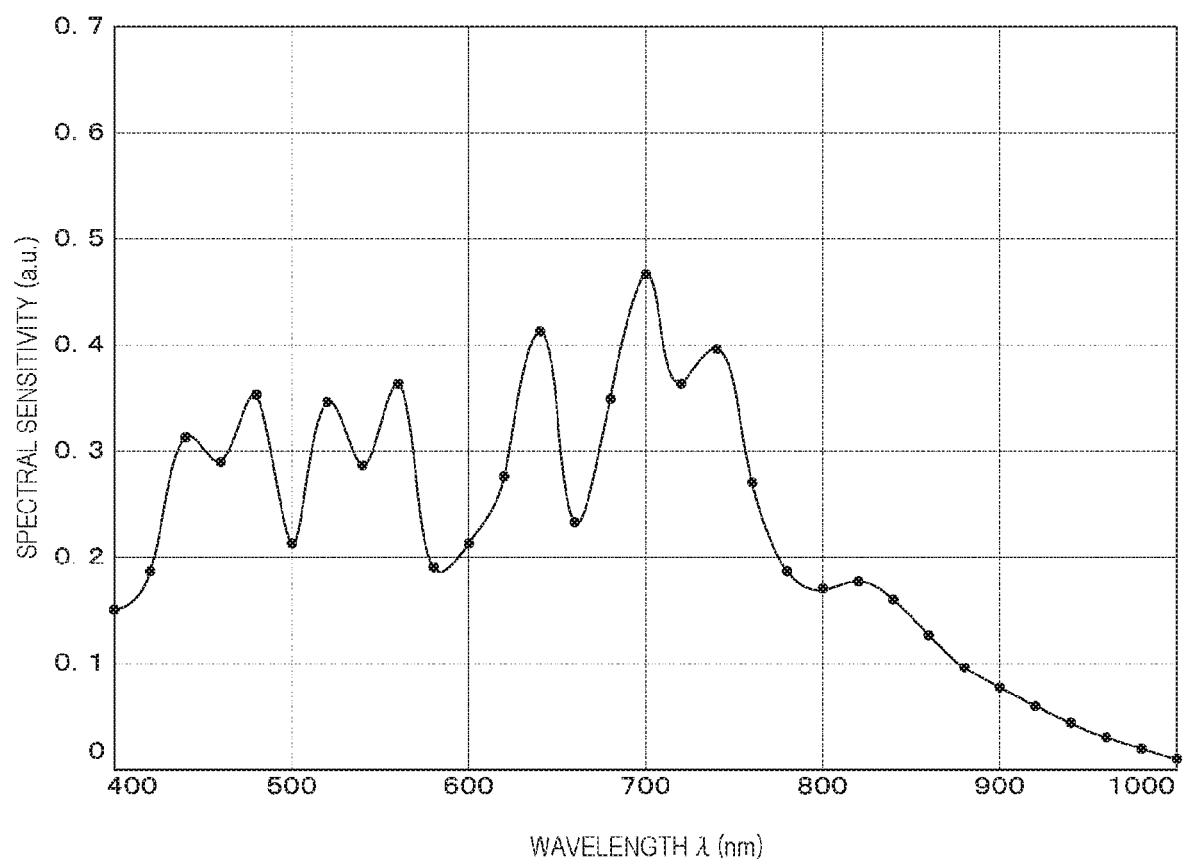
FIG. 8 is a graph illustrating an example of spectral sensitivity characteristics when a thickness was set to 1.0 micrometers (μm) according to the comparative example.

FIG. 8 is a graph illustrating an example of spectral sensitivity characteristics when the thickness d was set to 1.0 micrometers (μm).

Figure 9:
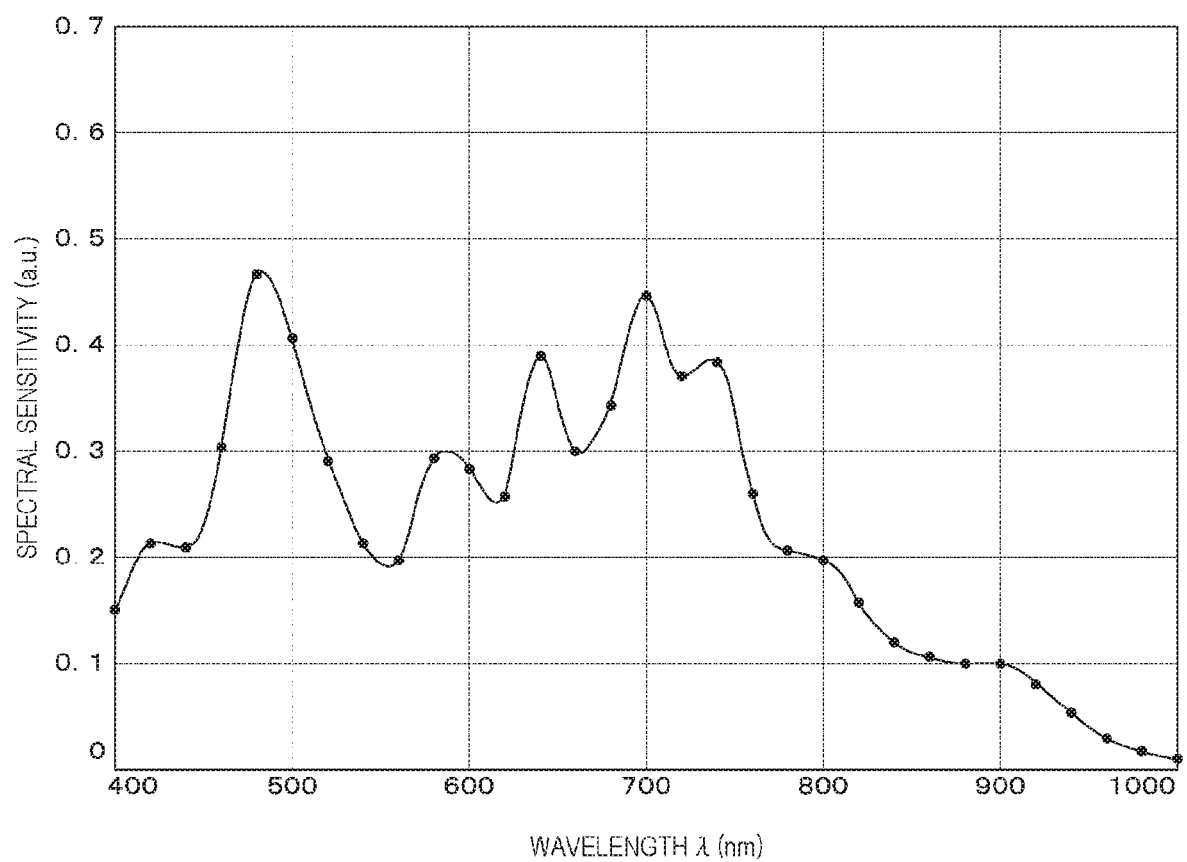
FIG. 9 is a graph illustrating an example of spectral sensitivity characteristics when a thickness was set to 1.5 micrometers (μm) according to the comparative example.

FIG. 9 is a graph illustrating an example of spectral sensitivity characteristics when the thickness d was set to 1.5 micrometers (μm).

Figure 10:
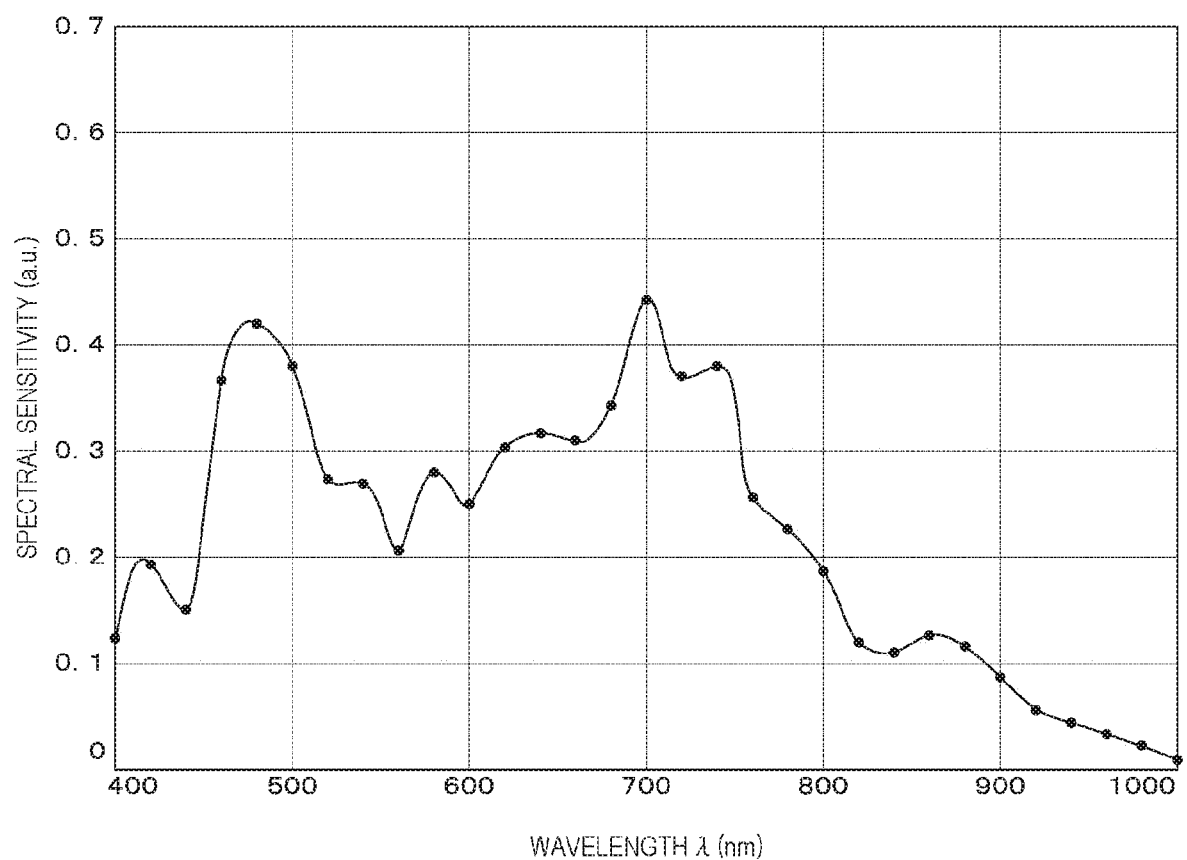
FIG. 10 is a graph illustrating an example of spectral sensitivity characteristics when a thickness was set to 2.0 micrometers (μm) according to the first embodiment of the present technology.

FIG. 10 is a graph illustrating an example of spectral sensitivity characteristics when the thickness d was set to 2.0 micrometers (μm).

Figure 11:
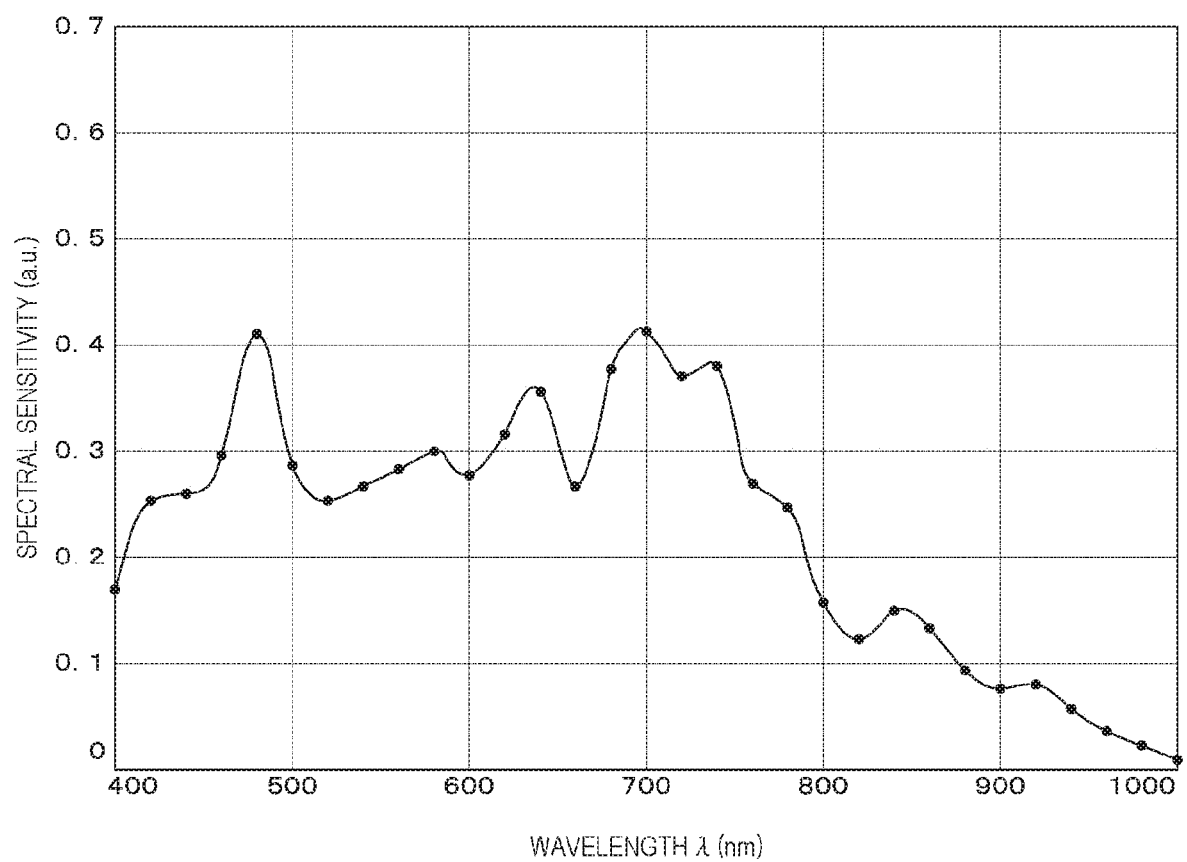
FIG. 11 is a graph illustrating an example of spectral sensitivity characteristics when a thickness was set to 2.5 micrometers (μm) according to the first embodiment of the present technology.

FIG. 11 is a graph illustrating an example of spectral sensitivity characteristics when the thickness d was set to 2.5 micrometers (μm). In FIGS. 7 to 11, a vertical axis indicates a spectral sensitivity and a horizontal axis indicates a wavelength.

Figure 12:
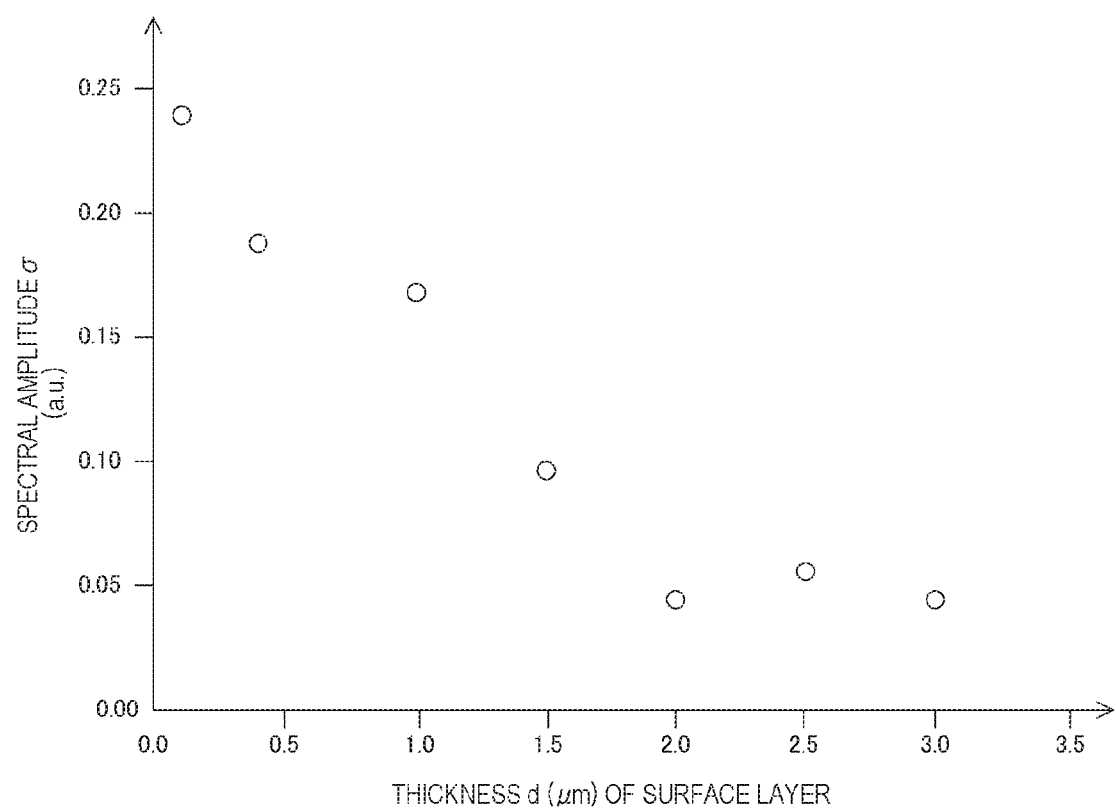
FIG. 12 is a graph illustrating a measurement result of a spectral amplitude according to the first embodiment of the present technology.

FIG. 12 is a graph illustrating a measurement result of a spectral amplitude according to the first embodiment of the present technology. In FIG. 12, a vertical axis indicates a spectral amplitude obtained from FIGS. 7 to 11, and a horizontal axis indicates the thickness d. This spectral amplitude represents a magnitude of ripple.

In a case where the thickness d is less than 2.0 micrometers (μm), the smaller the thickness d, the smaller the spectral amplitude (ripple) and the larger the reduction effect. On the other hand, in a case where the thickness d is 2.0 micrometers (μm) or more, the spectral amplitude is saturated. Therefore, in a case where the incident light is natural light, it is preferable that d is 2.0 micrometers (μm) or more.

Method of Manufacturing Electronic Device

Next, a method of manufacturing the electronic device 100 will be described. First, the solid-state imaging element 200 is formed on the support substrate 113 by a manufacturing system of the electronic device 100.

Figure 13:
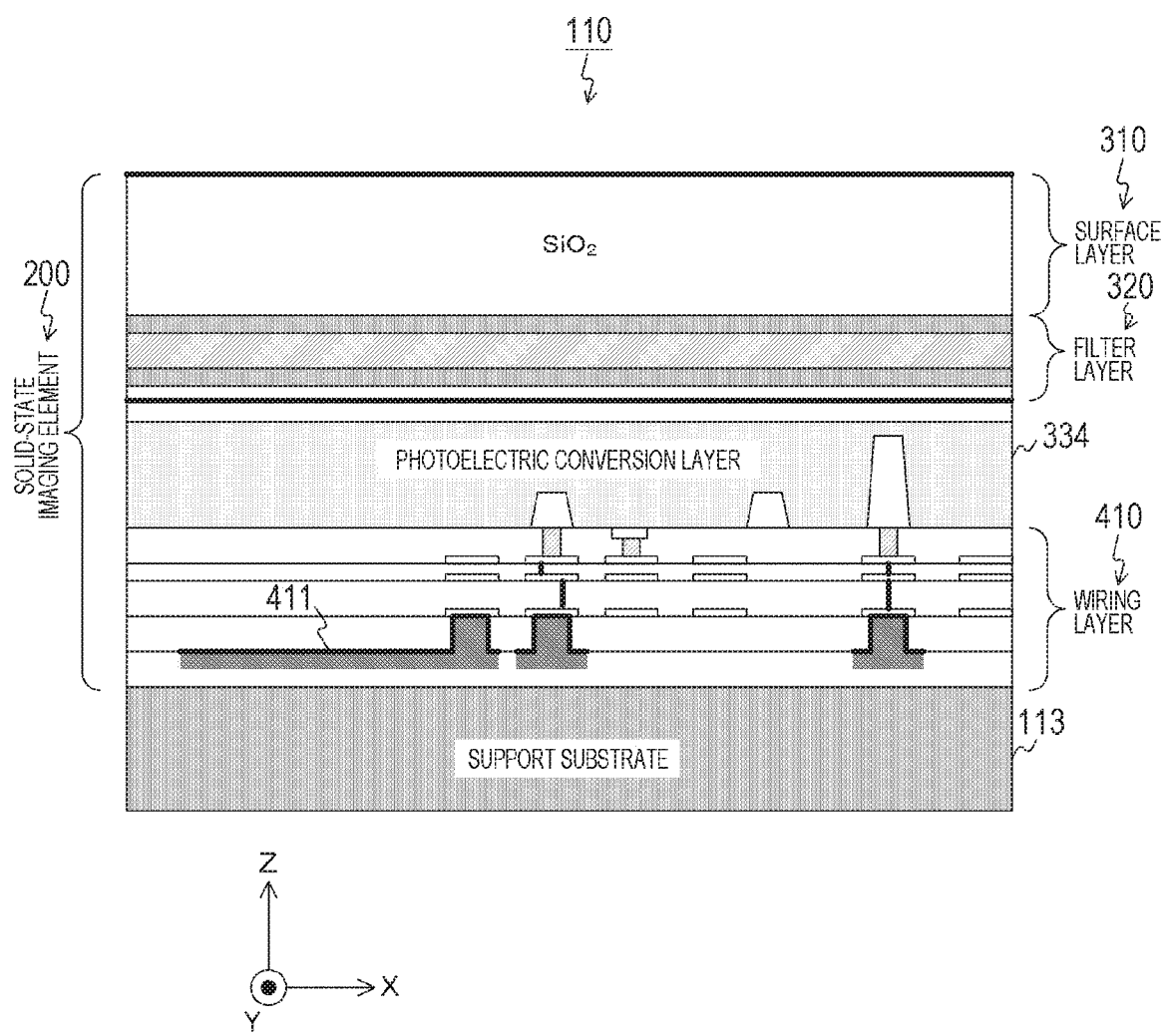
FIG. 13 is an example of a cross-sectional view of the electronic device in which the solid-state imaging element is formed according to the first embodiment of the present technology.

FIG. 13 is an example of a cross-sectional view of the electronic device 100 in which the solid-state imaging element 200 is formed according to the first embodiment of the present technology. In the solid-state imaging element 200, the surface layer 310 to the photoelectric conversion layer 334 are provided sequentially from the top, as described above, and a wiring layer 410 is provided below the photoelectric conversion layer 334. A pad 411 is provided on the wiring layer 410. Next, a resist that is partially opened is applied on the surface layer 310 of the solid-state imaging element 200.

Figure 14:
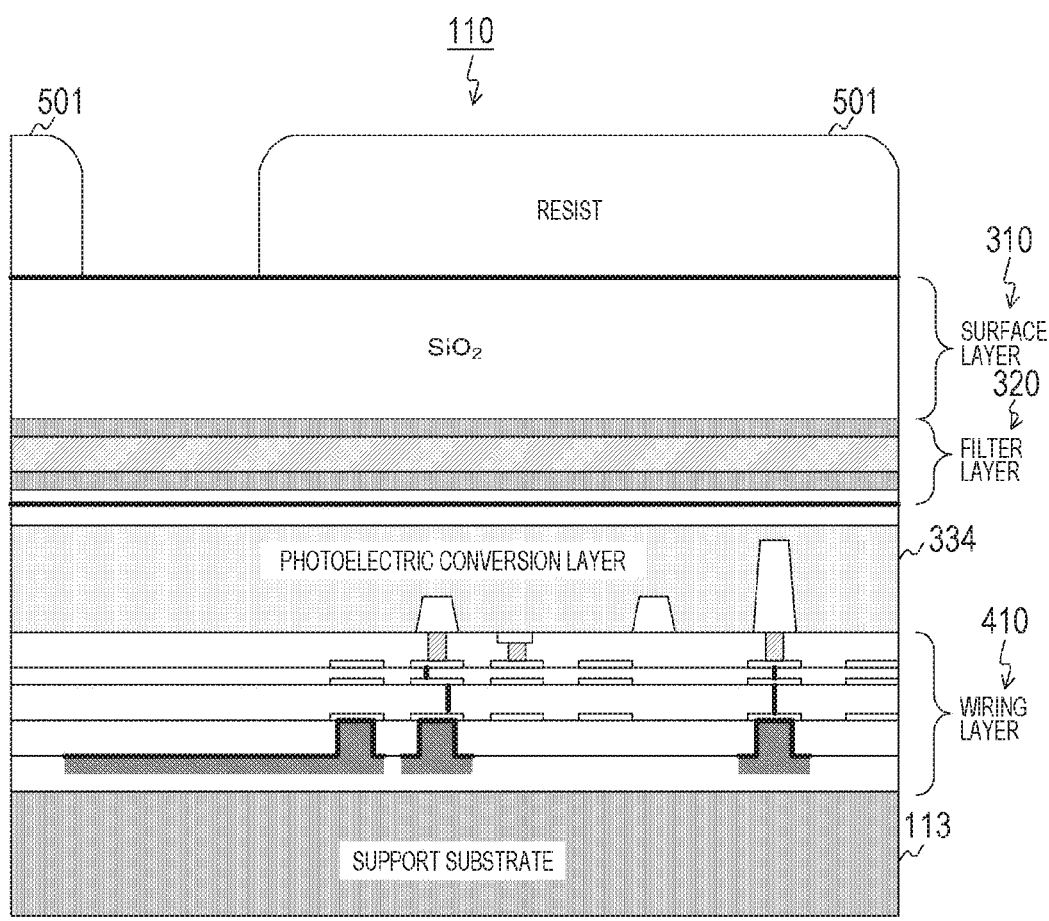
FIG. 14 is an example of a cross-sectional view of the electronic device in which a resist is applied according to the first embodiment of the present technology.

FIG. 14 is an example of a cross-sectional view of the electronic device 100 in which a resist is applied according to the first embodiment of the present technology. A resist 501 is opened at a connection place of the pad 411. Next, first etching is executed using a lithography technology. In lithography, mask exposure and development are sequentially executed. Then, the resist 501 is removed. Note that the etching may be any one of dry etching and wet etching.

Figure 15:
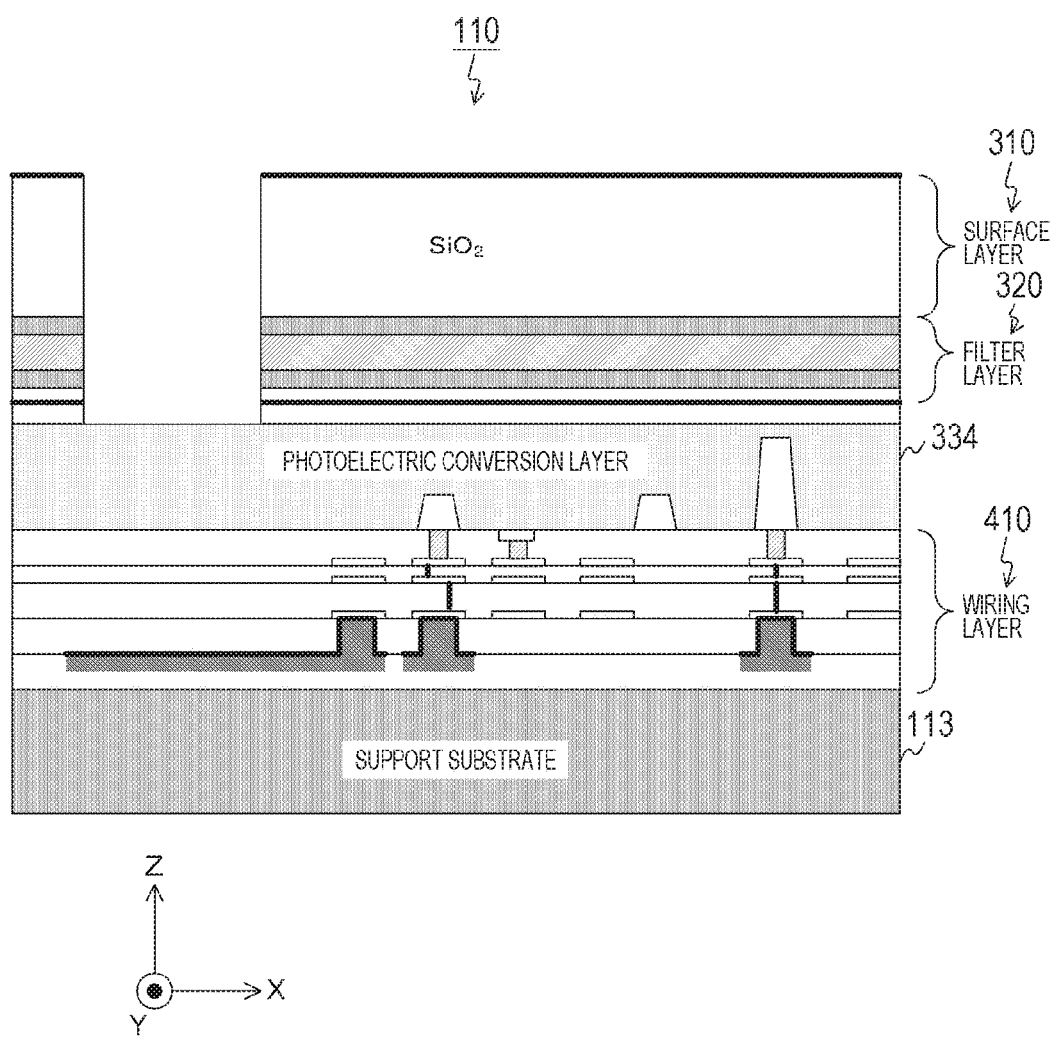
FIG. 15 is an example of a cross-sectional view of the electronic device that has been subjected to first etching according to the first embodiment of the present technology.

FIG. 15 is an example of a cross-sectional view of the electronic device 100 that has been subjected to the first etching according to the first embodiment of the present technology. By the first etching, the surface layer 310 and the filter layer 320 are partially opened, and the photoelectric conversion layer 334 in that part is exposed. A resist is applied on the solid-state imaging element 200 again.

Figure 16:
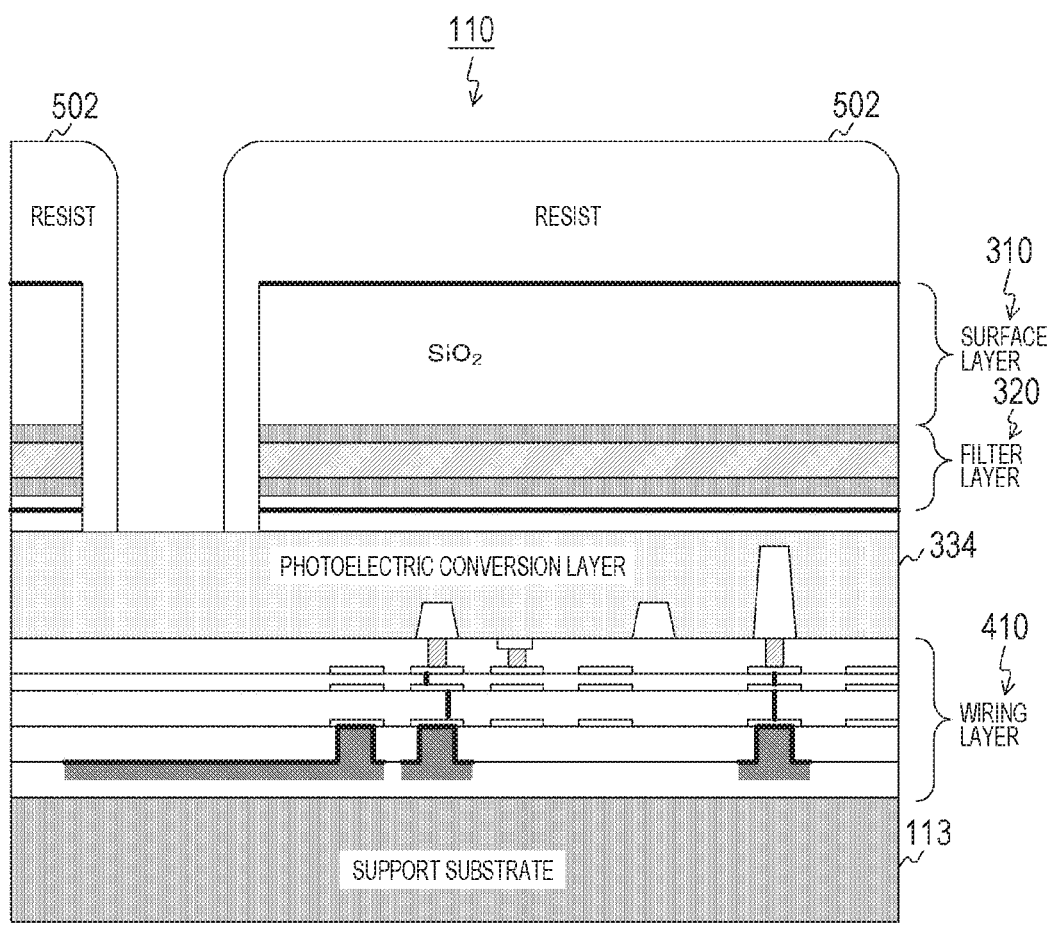
FIG. 16 is an example of a cross-sectional view of the electronic device in which a resist is applied after etching according to the first embodiment of the present technology.

FIG. 16 is an example of a cross-sectional view of the electronic device 100 in which a resist 502 is applied after etching according to the first embodiment of the present technology. As illustrated in FIG. 16, a part of the resist 502 is opened, and an area of that part is smaller than that of the opened part of the resist 501 in the first etching. Therefore, damage to the solid-state imaging element 200 at the time of second etching can be reduced. Next, second etching is executed using a lithography technology. Then, the resist 502 is removed.

Figure 17:
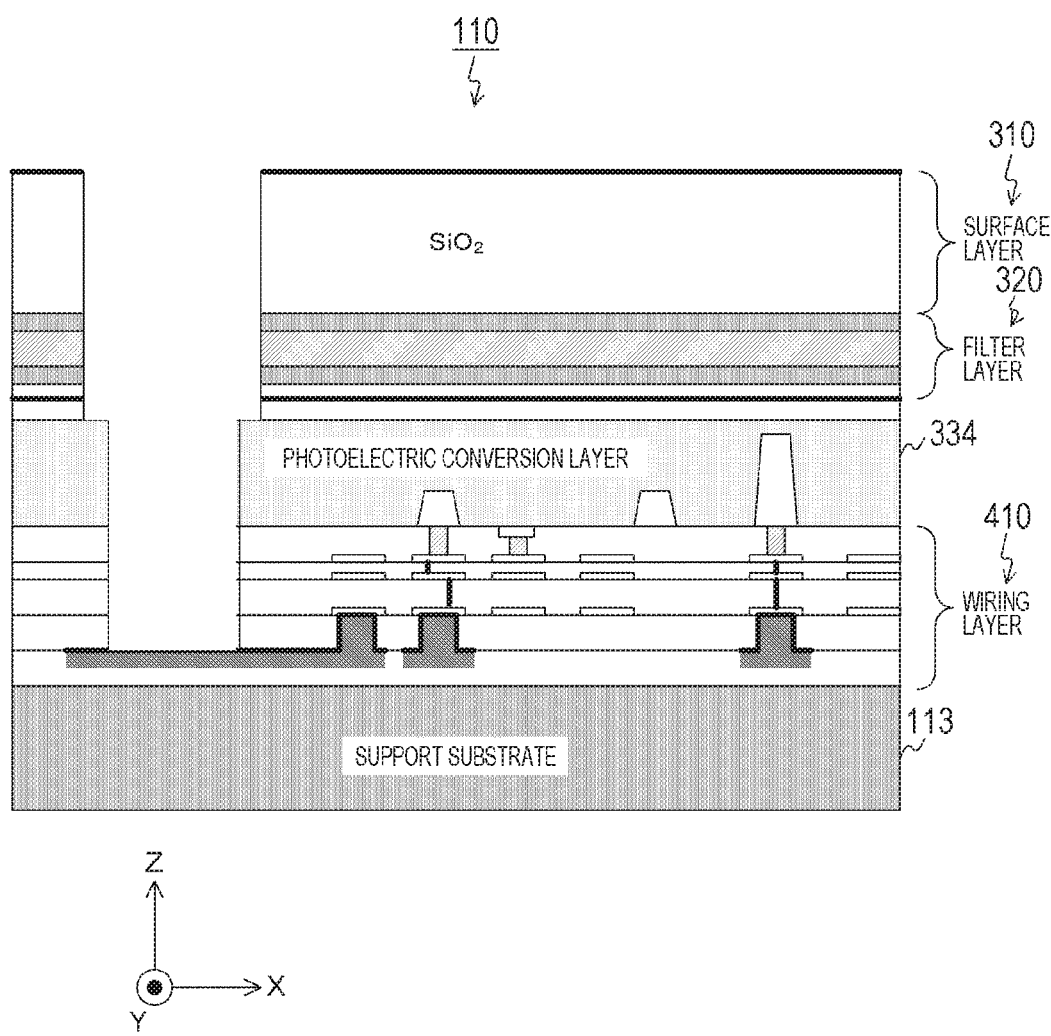
FIG. 17 is an example of a cross-sectional view of the electronic device that has been subjected to second etching according to the first embodiment of the present technology.

FIG. 17 is an example of a cross-sectional view of the electronic device 100 that has been subjected to the second etching according to the first embodiment of the present technology. By the second etching, the photoelectric conversion layer 334 and the wiring layer 410 are partially opened, and a connection place of the pad 411 is exposed. This connection place is connected to an electrode of the support substrate 113 by wire bonding. Therefore, the solid-state imaging element 200 and the support substrate 113 are electrically connected to each other. In addition, various processing is executed to complete the electronic device 100.

Figure 18:
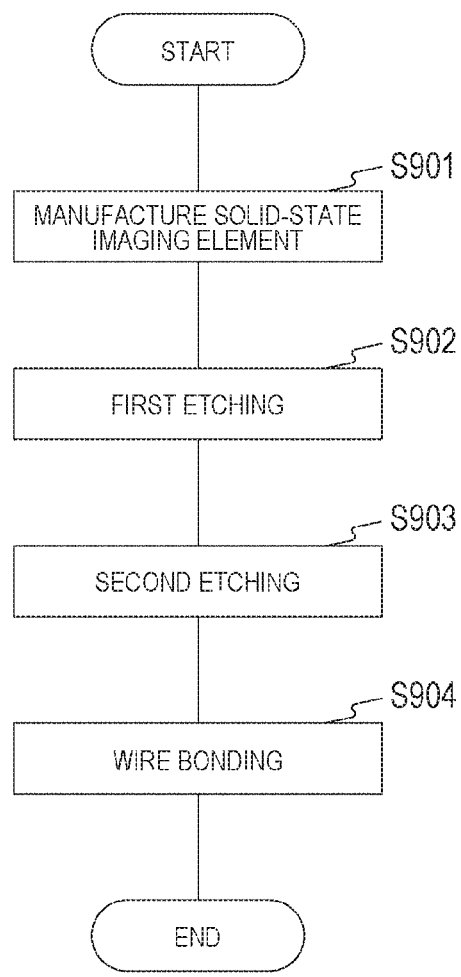
FIG. 18 is a flowchart illustrating an example of a method of manufacturing the electronic device according to the first embodiment of the present technology.

FIG. 18 is a flowchart illustrating an example of a method of manufacturing the electronic device 100 according to the first embodiment of the present technology. The manufacturing system manufactures the solid-state imaging element 200 on the support substrate 113 (step S901) and performs the first etching (step S902). Then, the manufacturing system performs the second etching (step S903), and electrically connects the solid-state imaging element 200 and the support substrate 113 to each other by the wire bonding (step S904). After step S904, the manufacturing system executes various processing and ends the manufacture of the electronic device 100.

As described above, according to the first embodiment of the present technology, the thickness of the surface layer 310 is made larger than the half of the coherence length, and the interference between the reflected light reflected by the light receiving surface of the surface layer 310 and the reflected light reflected by the interface below the surface layer 310 can thus be suppressed. Therefore, the ripple in the spectral spectrum can be reduced.

2. Second Embodiment

In the first embodiment described above, the silicon dioxide layer 311 has been used as the surface layer 310. However, when the silicon dioxide layer 311 is formed on a silicon wafer on which the filter layer 320 and the like are formed, warpage may occur in the silicon wafer at the time of heat treatment due to a difference in a coefficient of thermal expansion between the silicon dioxide layer 311 and the silicon wafer. In particular, as the silicon dioxide layer 311 becomes thicker, there is a possibility that the warpage of the silicon wafer will become larger. A solid-state imaging element 200 according to a second embodiment is different from the solid-state imaging element 200 according to the first embodiment in that a transparent resin layer is provided instead of the silicon dioxide layer 311.

Figure 19:
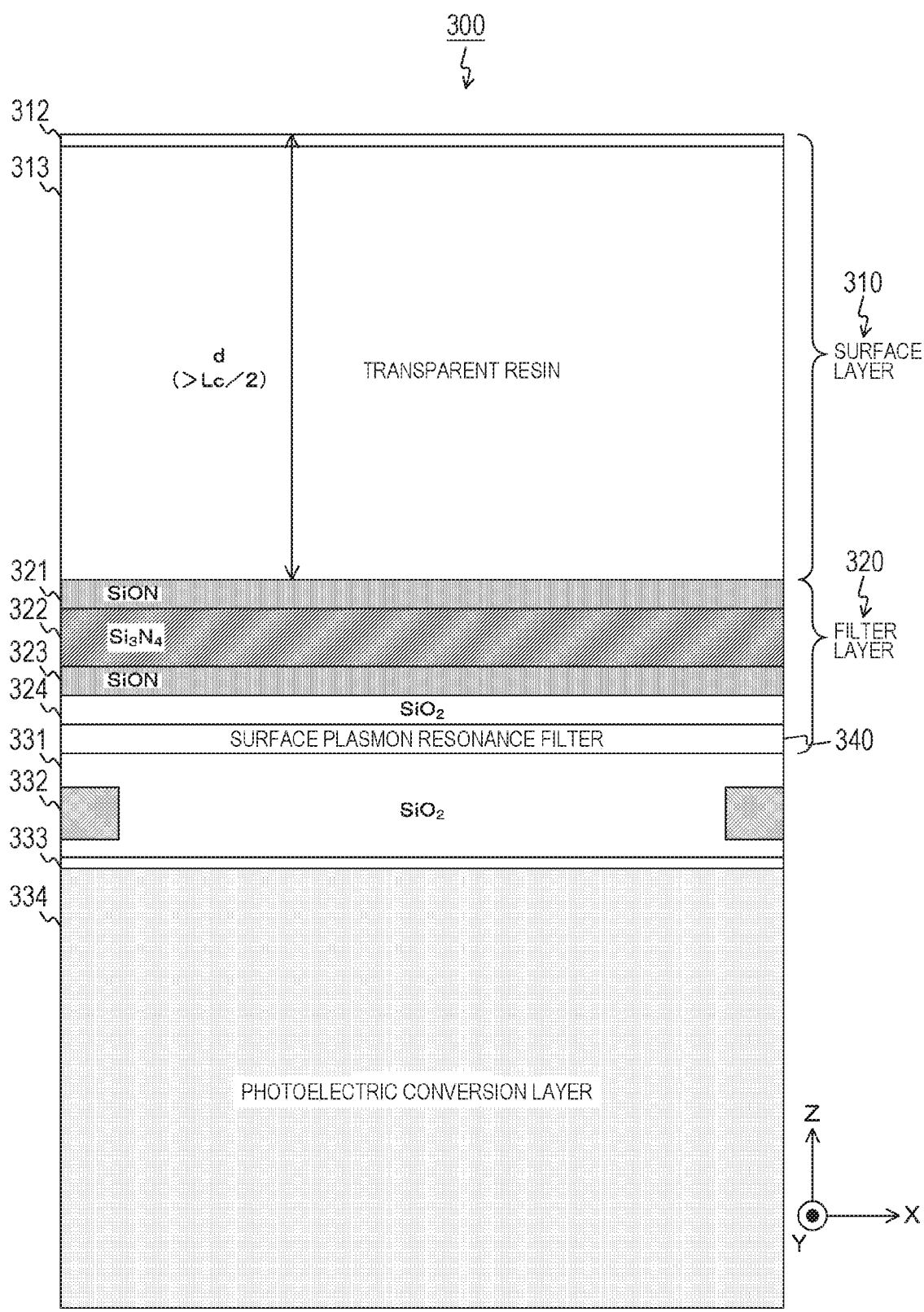
FIG. 19 is an example of a cross-sectional view of a pixel according to a second embodiment of the present technology.

FIG. 19 is an example of a cross-sectional view of a pixel 300 according to a second embodiment of the present technology. The pixel 300 according to the second embodiment is different from the pixel 300 according to the first embodiment in that in a surface layer 310, an antireflection film 312 and a transparent resin layer 313 are arranged sequentially from the top instead of the silicon dioxide layer 311. It is assumed that a thickness d of the surface layer 310 satisfies Equation 3, similarly to the first embodiment.

The antireflection film 312 is a film for reducing a reflectance of the surface layer 310, and silicon dioxide ($SiO_2$) or the like is used for the antireflection film 312. The antireflection film 312 is much thinner than the transparent resin layer 313. Note that the antireflection film 312 may not be formed.

As the transparent resin layer 313, for example, a resin whose difference in coefficient of thermal expansion from that of the silicon wafer is smaller than a difference in a coefficient of thermal expansion between silicon dioxide and the silicon wafer is used. By using such a resin, warpage of the silicon wafer due to heat treatment can be suppressed. Furthermore, the transparent resin layer 313 is formed by, for example, a spin coating method. By using the spin coating method, the surface layer 310 can be formed faster than a case where the silicon dioxide layer 311 is formed.

Figure 20:
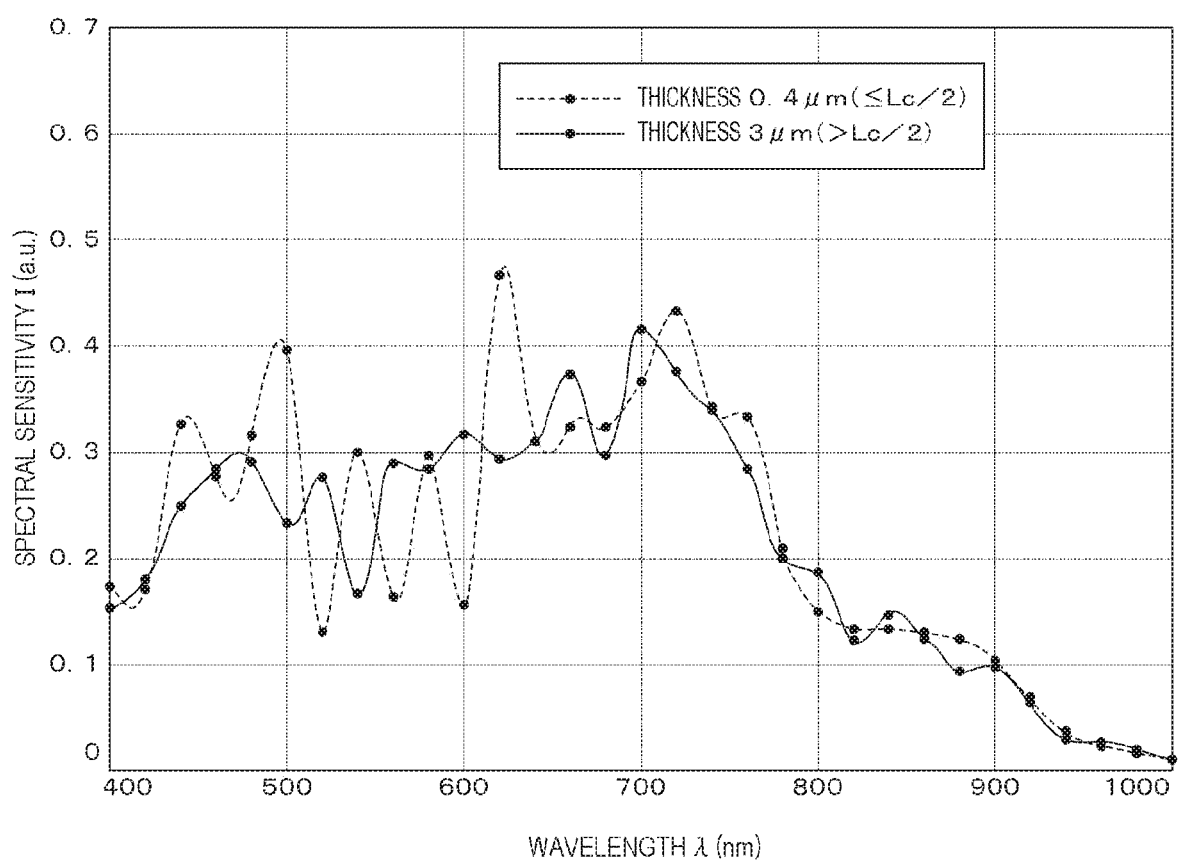
FIG. 20 is a graph illustrating an example of spectral sensitivity characteristics according to the second embodiment of the present technology.

FIG. 20 is a graph illustrating an example of spectral sensitivity characteristics according to the second embodiment of the present technology. In FIG. 20, a vertical axis indicates a spectral sensitivity and a horizontal axis indicates a wavelength. The thickness d was set to 3.0 micrometers (μm), which is a value satisfying Equation 3, and was obtained by a simulation using an FDTD method. Note that 3.0 micrometers (μm) is a thickness that can be generated by single coating by a spin coating method. In FIG. 20, a solid line indicates spectral sensitivity characteristics when the thickness d was 3.0 micrometers (μm).

Furthermore, for comparison, the thickness d was set to 0.4 μm, which is a value that does not satisfy Equation 3, and a similar simulation was performed. A dotted line in FIG. 20 indicates spectral sensitivity characteristics according to a comparative example. As illustrated in FIG. 20, by setting the thickness so as to satisfy Equation 3, an amplitude (ripple) can be made smaller than that of the comparative example in which Equation 3 is not satisfied.

Figure 21:
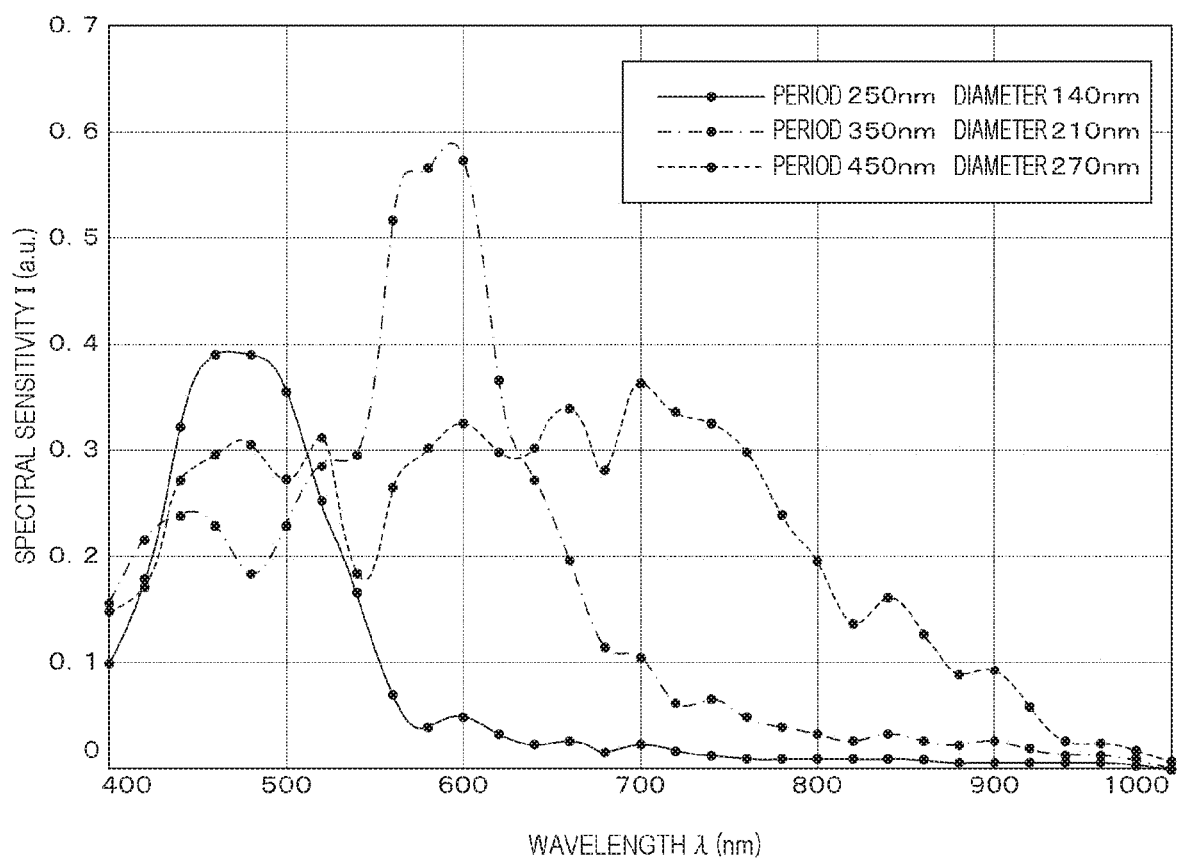
FIG. 21 is a graph illustrating an example of spectral sensitivity characteristics when a period and a diameter are changed according to the second embodiment of the present technology.

FIG. 21 is a graph illustrating an example of spectral sensitivity characteristics when a period and a diameter are changed according to the second embodiment of the present technology. In FIG. 21, a vertical axis indicates a spectral sensitivity and a horizontal axis indicates a wavelength. Furthermore, a solid line indicates spectral sensitivity characteristics of a pixel in which a surface plasmon resonance filter 340 has a period of 250 nanometers (nm) and a diameter of 140 nanometers (nm). An alternative long and short dash line indicates spectral sensitivity characteristics of a pixel in which a surface plasmon resonance filter 340 has a period of 350 nanometers (nm) and a diameter of 210 nanometers (nm). A dotted line indicates spectral sensitivity characteristics of a pixel in which a surface plasmon resonance filter 340 has a period of 450 nanometers (nm) and a diameter of 270 nanometers (nm). As illustrated in FIG. 21, different spectral sensitivity characteristics are obtained by changing at least one of the period and the diameter.

As described above, according to the second embodiment of the present technology, the transparent resin layer 313 whose difference in the coefficient of thermal expansion from that of the silicon wafer is smaller than the difference in the coefficient of thermal expansion between silicon dioxide and the silicon wafer is arranged as the surface layer having a thickness larger than the half of the coherence length, and the warpage of the silicon wafer due to the heat treatment can thus be suppressed.

3. Third Embodiment

In the second embodiment described above, the transparent resin layer 313 is formed on the silicon oxynitride layer 321, but in this configuration, there is a possibility that the transparent resin layer 313 will be peeled off at the time of performing dicing. A solid-state imaging element 200 according to a third embodiment is different from the solid-state imaging element 200 according to the second embodiment in that a stress relaxation resin layer is formed in order to improve adhesion of the transparent resin layer 313.

Figure 22:
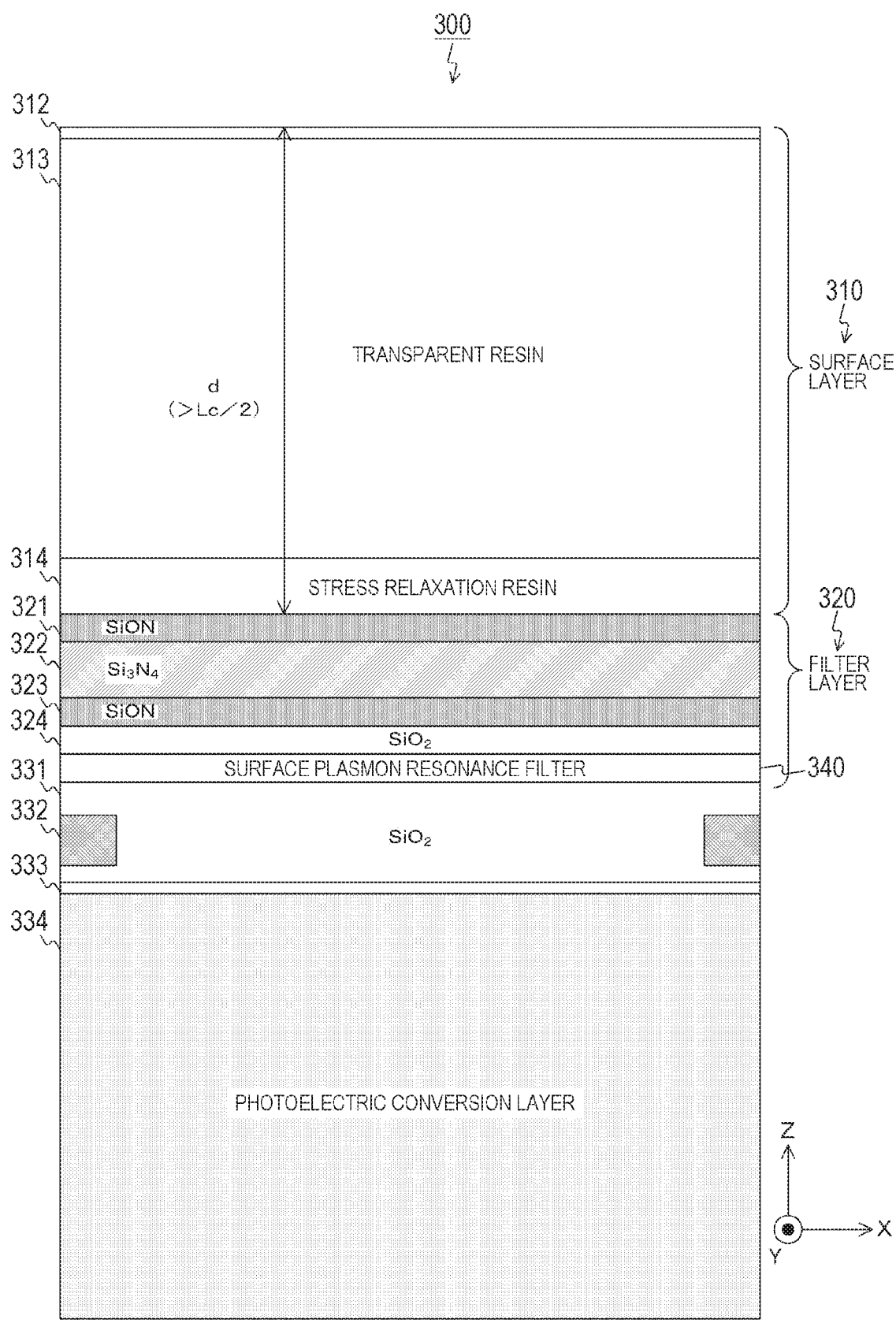
FIG. 22 is an example of a cross-sectional view of a pixel according to a third embodiment of the present technology.

FIG. 22 is an example of a cross-sectional view of a pixel 300 according to a third embodiment of the present technology. The pixel 300 according to the third embodiment is different from the pixel 300 according to the second embodiment in that a stress relaxation resin layer 314 is further formed below a transparent resin layer 313 in a surface layer 310.

The stress relaxation resin layer 314 is a layer that relaxes stress applied to the transparent resin layer 313. Furthermore, a thickness of the surface layer 310 including the stress relaxation resin layer 314 satisfies Equation 3, similarly to the first embodiment.

Figure 23:
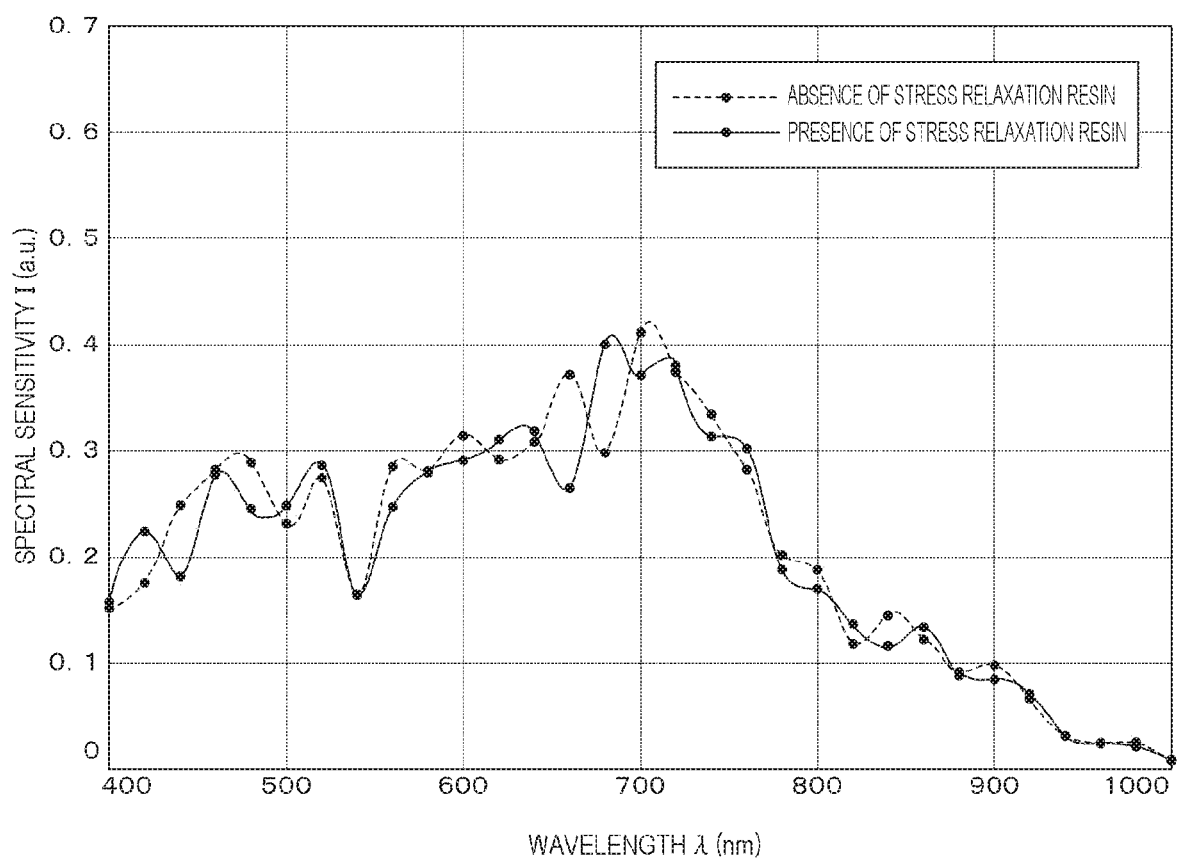
FIG. 23 is a graph illustrating an example of spectral sensitivity characteristics according to the third embodiment of the present technology.

FIG. 23 is a graph illustrating an example of spectral sensitivity characteristics according to the third embodiment of the present technology. In FIG. 23, a vertical axis indicates a spectral sensitivity and a horizontal axis indicates a wavelength. Furthermore, a solid line in FIG. 23 indicates spectral sensitivity characteristics of the pixel 300 according to the third embodiment having the stress relaxation resin layer 314. On the other hand, a dotted line in FIG. 23 indicates spectral sensitivity characteristics of the pixel 300 according to the second embodiment having no stress relaxation resin layer 314. Optically, when there is no stress relaxation resin layer 314, the number of interfaces is smaller, and it is thus considered that the ripple becomes smaller, but, as illustrated in FIG. 23, in reality, a large difference does not occur in spectral sensitivity characteristics depending on the presence or absence of the stress relaxation resin layer 314. Therefore, an increase in the ripple due to formation of the stress relaxation resin layer 314 does not occur.

As described above, according to the third embodiment of the present technology, the stress relaxation resin layer 314 is further formed, and it is thus possible to relax the stress applied to the transparent resin layer 313 to prevent the transparent resin layer 313 from being peeled off.

4. Fourth Embodiment

In the first embodiment described above, a desired wavelength has been transmitted by the surface plasmon resonance filter 340 in which the fine holes 341 are formed, but there is a possibility that it will become difficult to perform fine processing for forming the holes 341. A solid-state imaging element 200 according to a fourth embodiment is different from the solid-state imaging element according to the first embodiment in that a Fabry-Perot resonator in which holes need not be formed is used instead of the surface plasmon resonance filter 340.

Figure 24:
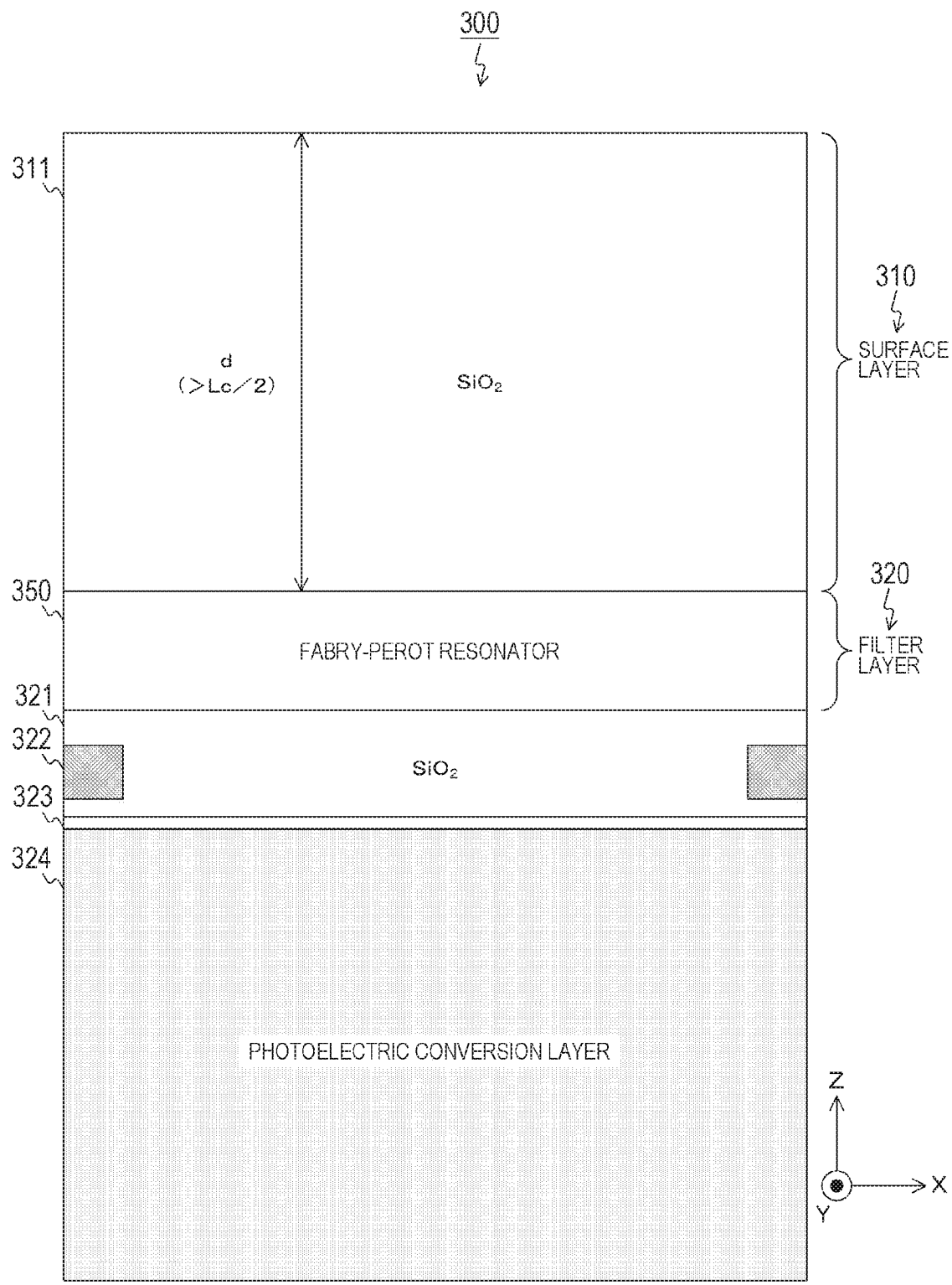
FIG. 24 is an example of a cross-sectional view of a pixel according to a fourth embodiment of the present technology.

FIG. 24 is an example of a cross-sectional view of a pixel 300 according to a fourth embodiment of the present technology. The pixel 300 according to the fourth embodiment is different from the pixel 300 according to the first embodiment in that a Fabry-Perot resonator 350 is arranged instead of each layer from the silicon oxynitride layer 321 to the surface plasmon resonance filter 340, in the filter layer 320. The Fabry-Perot resonator 350 is a resonator that transmits light of a predetermined wavelength by opposing two half mirrors to each other and utilizing resonance between light reflected multiply between these half mirrors. These half mirrors do not have holes and do not require fine processing such as processing for the surface plasmon resonance filter.

Figure 25:
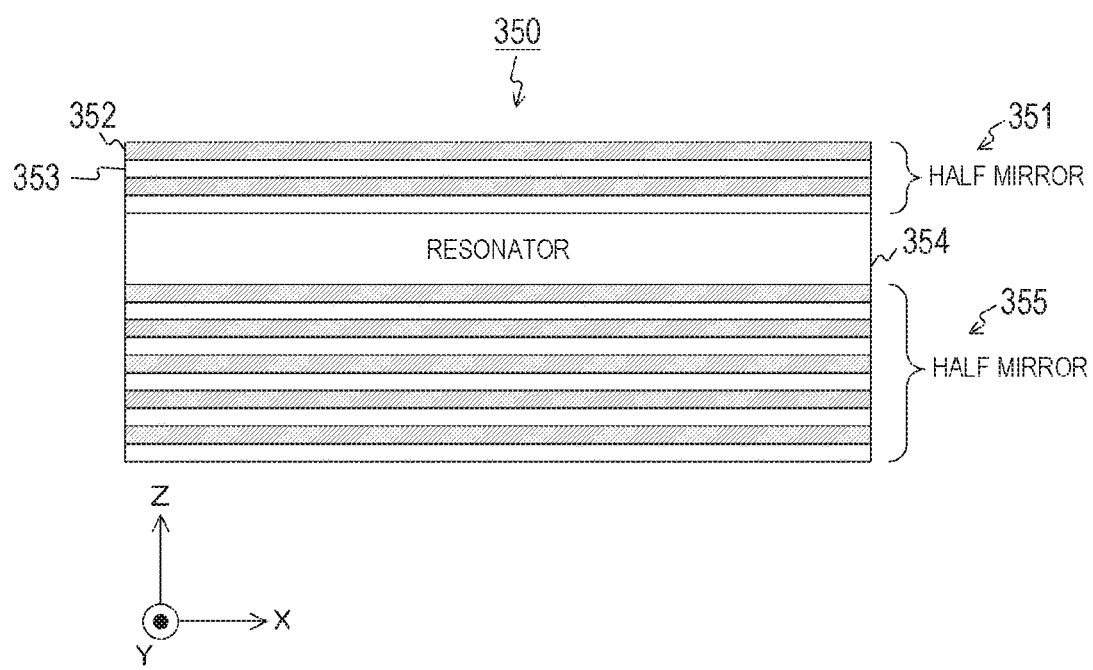
FIG. 25 is an example of a cross-sectional view of a Fabry-Perot resonator according to the fourth embodiment of the present technology.

FIG. 25 is an example of a cross-sectional view of the Fabry-Perot resonator 350 according to the fourth embodiment of the present technology. The Fabry-Perot resonator 350 includes a half mirror 351, a resonator 354, and a half mirror 355 arranged sequentially from the top. The half mirror 351 transmits a part of incident light and reflects the rest of the incident light, and includes a multilayer film in which titanium oxide ($TiO_2$) layers 352 and silicon dioxide layers 353 are alternately arranged. The same applies to the half mirror 355. Note that the multilayer films are used as the half mirrors 351 and 355, but metal thin films or the like other than the multilayer films can be used as the half mirrors if they can reflect a part of the incident light.

The resonator 354 includes, for example, a silicon dioxide layer. A wavelength to be transmitted can be adjusted by changing a thickness of the resonator 354. In a pixel block 221, the thicknesses of the resonators 354 of each of the sixteen pixels 300 are different from each other. Therefore, it is possible to disperse the incident light into sixteen wavelengths.

Note that in the fourth embodiment, a transparent resin layer 313 may be arranged as a surface layer 310 as in the second embodiment. Furthermore, a stress relaxation resin layer 314 may be further arranged as in the third embodiment.

As described above, in the fourth embodiment of the present technology, the Fabry-Perot resonator 350 is arranged as the filter layer 320, and thus, fine processing is not required as compared with a configuration in which the surface plasmon resonance filter 340 is arranged, such that manufacturing becomes easy.

5. Fifth Embodiment

In the first embodiment described above, the electronic device 100 performs only the dispersion of the incident light. However, at the time of performing a survey on a growth state (that is, vegetation) of a plant, it is preferable to calculate a normalized difference vegetation index (NDVI) after the dispersion. Here, the NDVI is a numerical value indicating a state of the vegetation, and the larger the positive value of the NDVI, the denser the vegetation. A solid-state imaging element 200 according to the fifth embodiment is different from the solid-state imaging element 200 according to the first embodiment in that the NDVI is calculated.

Figure 26:
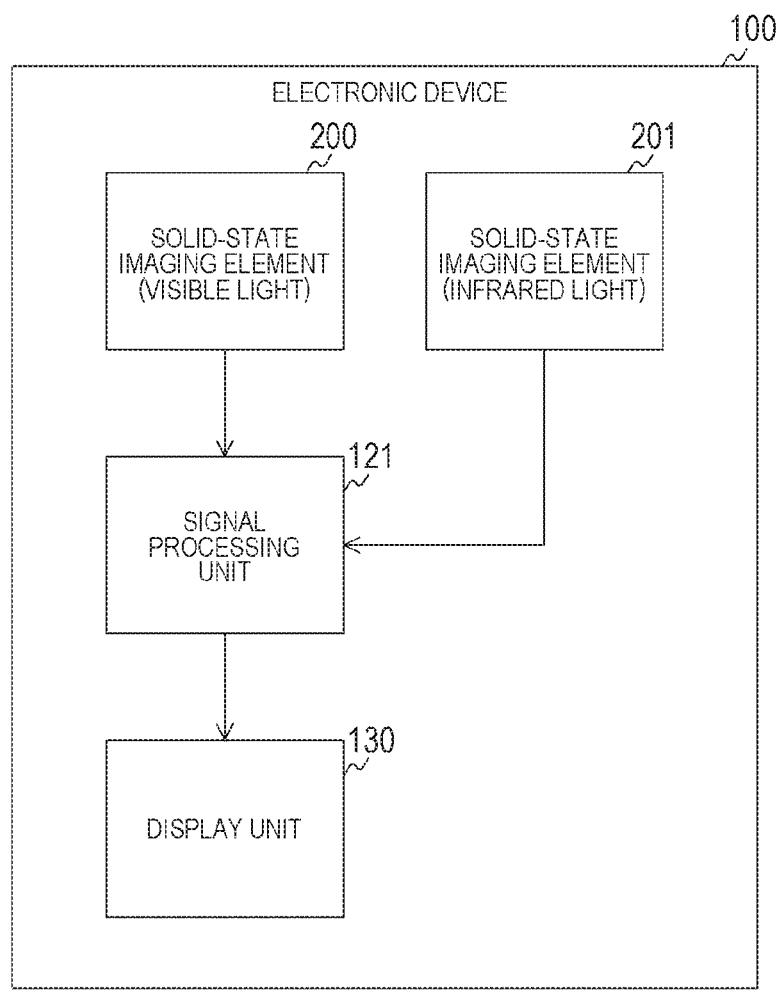
FIG. 26 is a block diagram illustrating a configuration example of an electronic device according to a fifth embodiment of the present technology.

FIG. 26 is a block diagram illustrating a configuration example of an electronic device 100 according to a fifth embodiment of the present technology. The electronic device 100 according to the fifth embodiment is different from the electronic device 100 according to the first embodiment in that it further includes a solid-state imaging element 201 and includes a signal processing unit 121 instead of the signal processing unit 120. As the electronic device 100 according to the fifth embodiment, for example, a camera mounted on a drone (small unmanned helicopter or the like) is assumed.

A solid-state imaging element 200 disperses visible light and supplies image data to the signal processing unit 121. On the other hand, the solid-state imaging element 201 disperses invisible light such as infrared light or the like and supplies image data to the signal processing unit 121.

The signal processing unit 121 obtains a reflectance of a subject with respect to red visible light as a reflectance R from the image data of the solid-state imaging element 200, and obtains a reflectance of the subject with respect to near infrared light as a reflectance IR from the image data of the solid-state imaging element 201. Then, the signal processing unit 121 calculates an NDVI by the following equation and supplies the NDVI to the display unit 130.

$$NDVI = (IR-R)/(IR+R)$$

Figure 27:
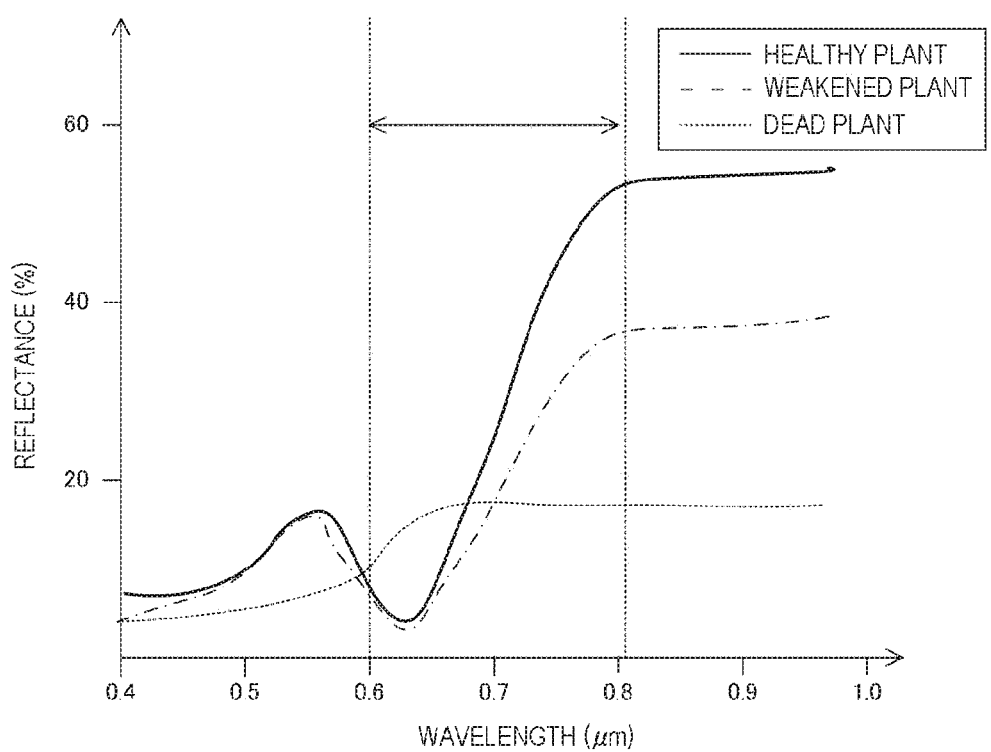
FIG. 27 is a graph illustrating an example of a reflectance for every wavelength according to the fifth embodiment of the present technology.

FIG. 27 is a graph illustrating an example of a reflectance for every wavelength according to the fifth embodiment of the present technology. In FIG. 27, a vertical axis indicates a reflectance of a subject (plant or the like) and a horizontal axis indicates a wavelength. A solid line indicates reflectance characteristics of a healthy plant and an alternative long and short dash line indicates reflectance characteristics of a weakened plant. Furthermore, a dotted line indicates reflectance characteristics of a dead plant. As illustrated in FIG. 27, a difference in a reflectance for every state of the plants becomes large in a visible light region of 0.6 to 0.8 micrometers (µm). Furthermore, the difference becomes larger in an infrared light region longer than 0.8 micrometers (µm). Therefore, it is possible to decide the state of the vegetation by detecting signal levels in the visible light region and the infrared light region by the solid-state imaging elements 200 and 201. Then, by mounting such an electronic device 100 on the drone and observing a growth state (vegetation) of a crop from the sky, a user can efficiently grow the crop.

Note that it is also possible to calculate the NDVI by arranging three or more solid-state imaging elements whose wavelength regions in which photoelectric conversion is performed are different from each other and detect signal levels from three or more wavelength regions.

Furthermore, in the fifth embodiment, a transparent resin layer 313 may be arranged as a surface layer 310 as in the second embodiment. Furthermore, a stress relaxation resin 314 may be further arranged as in the third embodiment. Furthermore, a Fabry-Perot resonator 350 may be arranged as in the fourth embodiment.

As described above, according to the fifth embodiment of the present technology, by obtaining the reflectance of the subject with respect to the visible light and the reflectance of the subject with respect to the invisible light, the electronic device 100 can calculate the normalized difference vegetation index (NDVI).

6. Sixth Embodiment

In the first embodiment described above, the electronic device 100 performs only the dispersion of the incident light. However, at the time of using the electronic device 100 for biometric authentication, it is preferable to analyze a spectral spectrum and further decide whether or not a subject is human skin. An electronic device 100 according to a sixth embodiment is different from the electronic device 100 according to the first embodiment in that biometric authentication is performed using a spectral spectrum.

Figure 28:
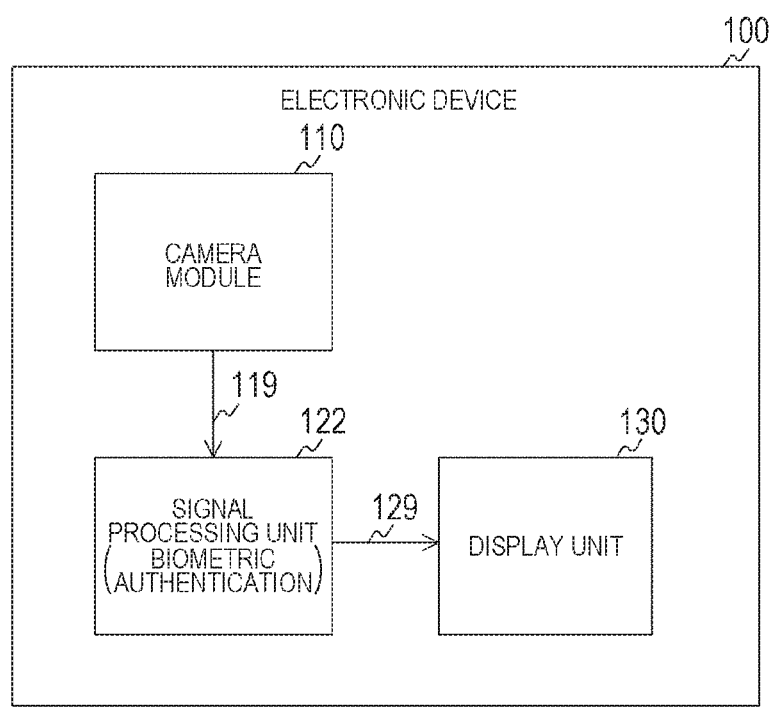
FIG. 28 is a block diagram illustrating a configuration example of an electronic device according to a sixth embodiment of the present technology.

FIG. 28 is a block diagram illustrating a configuration example of an electronic device 100 according to a sixth embodiment of the present technology. The electronic device 100 according to the sixth embodiment is different from the electronic device 100 according to the first embodiment in that it includes a signal processing unit 122 instead of the signal processing unit 120. As the electronic device 100 according to the sixth embodiment, for example, a device or an apparatus (such as a smartphone or the like) having a biometric authentication function is assumed.

The signal processing unit 122 performs biometric authentication. In the biometric authentication, the signal processing unit 122 analyzes a spectral spectrum and decides whether or not a subject is human skin. Then, in a case where the subject is the human skin, matching between a biometric pattern (a face, a fingerprint, an iris, or the like) of the subject and a registered pattern registered in advance is performed, and a matching result is supplied to the display unit 130. As described above, by deciding whether or not the subject is the human skin using the spectral spectrum, it is possible to improve authentication accuracy as compared with a case where this decision is not performed.

Figure 29:
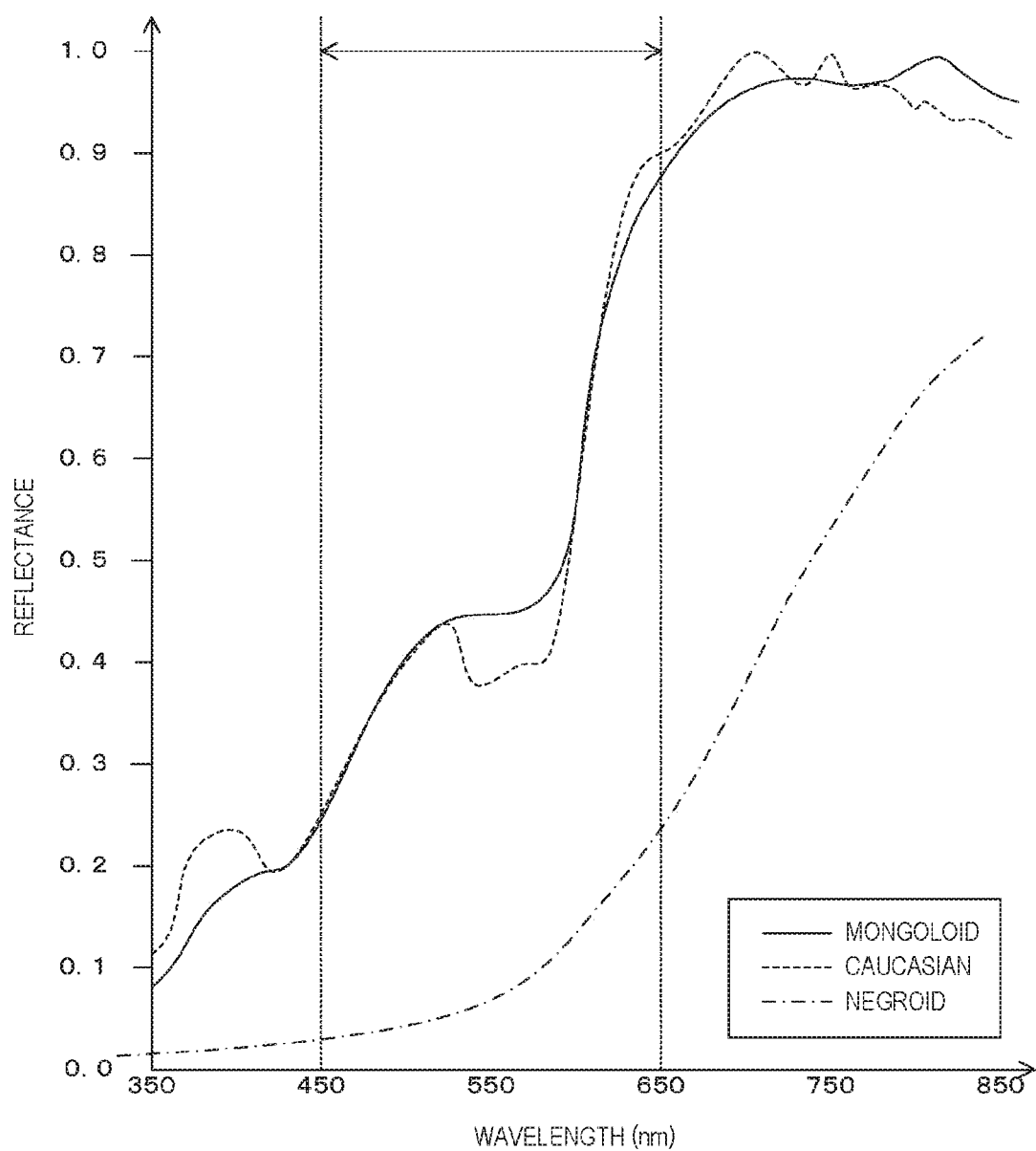
FIG. 29 is a graph illustrating an example of a reflectance for every wavelength according to the sixth embodiment of the present technology.

FIG. 29 is a graph illustrating an example of a reflectance for every wavelength according to the sixth embodiment of the present technology. In FIG. 29, a vertical axis indicates a reflectance of the subject and a horizontal axis indicates a wavelength. In FIG. 29, a solid line indicates reflectance characteristics of Mongoloid skin and a dotted line indicates reflectance characteristics of Caucasian skin. An alternate long and short dash line indicates reflectance characteristics of Negroid skin. In either case, a reflectance greatly changes in a wavelength range of 450 to 650 nanometers (nm). Therefore, for example, by analyzing a spectral spectrum in this wavelength range, the signal processing unit 122 can decide whether or not the subject is human skin.

Note that in the sixth embodiment, a transparent resin layer 313 may be arranged as a surface layer 310 as in the second embodiment. Furthermore, a stress relaxation resin 314 may be further arranged as in the third embodiment. Furthermore, a Fabry-Perot resonator 350 may be arranged as in the fourth embodiment.

As described above, according to the sixth embodiment of the present technology, the electronic device 100 decides whether or not the subject is the human skin using the spectral spectrum in the biometric authentication, and it is thus possible to improve accuracy of the biometric authentication as compared with a case where such a decision is not performed.

7. Application Example to Endoscopic Surgery System

The technology according to the present disclosure can be applied to various products. For example, the technology according to the present disclosure may be applied to an endoscopic surgery system.

Figure 30:
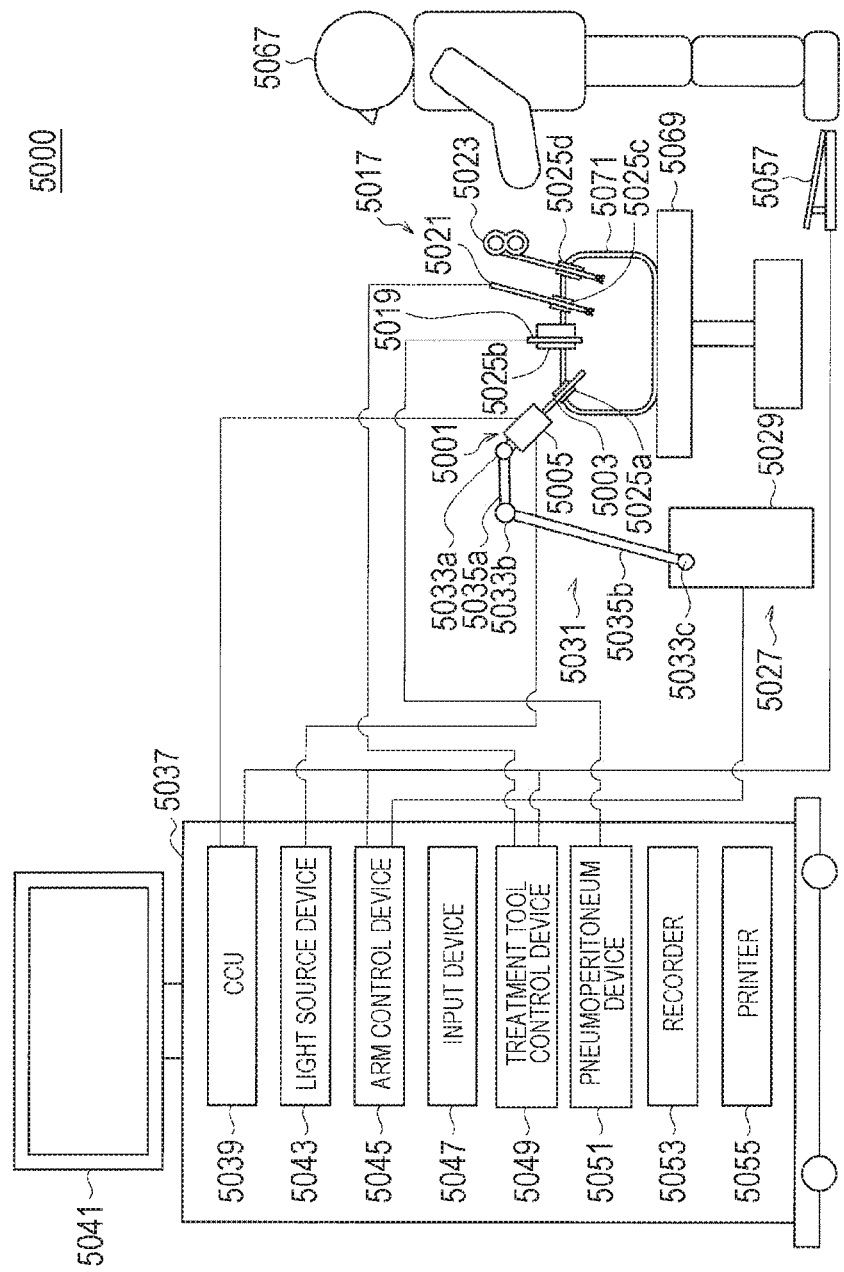
FIG. 30 is a diagram illustrating an example of a schematic configuration of an endoscopic surgery system.

FIG. 30 is a diagram illustrating an example of a schematic configuration of an endoscopic surgery system 5000 to which the technology according to the present disclosure can be applied. In FIG. 30, an aspect in which an operator (surgeon) 5067 performs surgery on a patient 5071 on a patient bed 5069 using the endoscopic surgery system 5000 is illustrated. As illustrated in FIG. 30, the endoscopic surgery system 5000 includes an endoscope 5001, other surgical tools 5017, a support arm device 5027 supporting the endoscope 5001, and a cart 5037 on which various devices for endoscopic surgery are mounted.

In the endoscopic surgery, a plurality of tubular opening tools called trocars 5025a to 5025d is punctured into the abdominal wall instead of cutting the abdominal wall to open the abdomen. Then, a lens barrel 5003 of the endoscope 5001 or other surgical tools 5017 are inserted from the trocars 5025a to 5025d into the body cavity of the patient 5071. In the illustrated example, a pneumoperitoneum tube 5019, an energy treatment tool 5021, and forceps 5023 are inserted as other surgical tools 5017 into the body cavity of the patient 5071. Furthermore, the energy treatment tool 5021 is a treatment tool performing incision and ablation of a tissue, sealing of blood vessels, or the like, by using a high-frequency current and ultrasonic vibrations. However, the illustrated surgical tool 5017 is merely an example, and various surgical tools generally used in the endoscopic surgery, such as tweezers, a retractor, and the like, may be used as the surgical tool 5017.

An image of the surgical site in the body cavity of the patient 5071 captured by the endoscope 5001 is displayed on a display device 5041. The operator 5067 performs a treatment such as excision of the affected part, or the like, using the energy treatment tool 5021 or the forceps 5023 while viewing the image of the surgical site displayed on the display device 5041 in real time. Note that although not illustrated, the pneumoperitoneum tube 5019, the energy treatment tool 5021, and the forceps 5023 are supported by the operator 5067, an assistant, or the like during the surgery.

(Support Arm Device)

The support arm device 5027 includes an arm portion 5031 extending from a base portion 5029. In the illustrated example, the arm portion 5031 includes joint portions 5033a, 5033b, and 5033c, and links 5035a and 5035b, and is driven under control of an arm control device 5045. The endoscope 5001 is supported by the arm portion 5031, such that a position and a posture of the endoscope 5001 are controlled. Therefore, stable fixing of the position of the endoscope 5001 can be realized.

(Endoscope)

The endoscope 5001 includes a lens barrel 5003 whose region of a predetermined length from a tip is inserted into the body cavity of the patient 5071, and a camera head 5005 connected to a base end of the lens barrel 5003. The endoscope 5001 configured as a so-called rigid scope having a rigid lens barrel 5003 is illustrated in the illustrated example, but the endoscope 5001 may be configured as a so-called flexible scope having a flexible lens barrel 5003.

An opening into which an objective lens is fitted is provided at the tip of the lens barrel 5003. A light source device 5043 is connected to the endoscope 5001, such that light generated by the light source device 5043 is guided up to the tip of the lens barrel by a light guide extended inside the lens barrel 5003 and is emitted toward an observation target in the body cavity of the patient 5071 via the objective lens. Note that the endoscope 5001 may be a forward-viewing endoscope or may be an oblique-viewing endoscope or a side-viewing endoscope.

An optical system and an imaging element are provided inside the camera head 5005, and reflected light (observation light) from the observation target is condensed on the imaging element by the optical system. The observation light is photoelectrically converted by the imaging element, such that an electric signal corresponding to the observation light, that is, an image signal corresponding to an observation image is generated. The image signal is transmitted as RAW data to a camera control unit (CCU) 5039. Note that the camera head 5005 has a function of adjusting a magnification and a focal length by appropriately driving the optical system.

Note that the camera head 5005 may be provided with a plurality of imaging elements in order to support, for example, stereoscopic vision (3D display) and the like. In this case, a plurality of relay optical systems is provided inside the lens barrel 5003 in order to guide observation light to each of the plurality of imaging elements.

(Various Devices Mounted on Cart)

The CCU 5039 includes a central processing unit (CPU), a graphics processing unit (GPU), or the like, and comprehensively controls operations of the endoscope 5001 and a display device 5041. Specifically, the CCU 5039 performs various image processing for displaying an image based on the image signal, such as development processing (demosaic processing) and the like, on the image signal received from the camera head 5005. The CCU 5039 provides the image signal on which the image processing is performed to the display device 5041. Furthermore, the CCU 5039 transmits a control signal to the camera head 5005 to control drive of the camera head 5005. The control signal can include information regarding an imaging condition such as a magnification, a focal length, or the like.

The display device 5041 displays the image based on the image signal on which the image processing is performed by the CCU 5039, under control of the CCU 5039. In a case where the endoscope 5001 is an endoscope corresponding to imaging of high resolution such as 4K (3840 horizontal pixels×2160 vertical pixels), 8K (7680 horizontal pixels× 4320 vertical pixels), or the like and/or in a case where the endoscope 5001 is an endoscope corresponding to a 3D display, a display device capable of a high resolution display and/or a display device capable of the 3D display can be used as the display device 5041, so as to correspond to these cases, respectively. In a case where the endoscope 5001 is the endoscope corresponding to the imaging of the high resolution such as 4K, 8K, or the like, a more immersive feeling can be obtained by using a display device having a size of 55 inches or more as the display device 5041. Furthermore, a plurality of display devices 5041 having different resolutions and sizes may be provided depending on a purpose.

The light source device 5043 includes a light source such as an LED or the like, and supplies irradiated light to the endoscope 5001 at the time of imaging the surgical site.

The arm control device 5045 includes a processor such as a CPU or the like, and operates according to a predetermined program to control the drive of the arm portion 5031 of the support arm device 5027 according to a predetermined control manner.

The input device 5047 is an input interface for the endoscopic surgery system 5000. A user can input various information or various instructions to the endoscopic surgery system 5000 via the input device 5047. For example, the user inputs various information regarding the surgery, such as physical information of the patient, information about a surgical procedure, or the like, via the input device 5047. Furthermore, for example, the user inputs an instruction to drive the arm portion 5031, an instruction to change the imaging condition (a type of irradiated light, a magnification, a focal length, and the like) by the endoscope 5001, an instruction to drive the energy treatment tool 5021, or the like, via the input device 5047.

A type of the input device 5047 is not limited, and the input device 5047 may be various known input devices. As the input device 5047, for example, a mouse, a keyboard, a touch panel, a switch, a foot switch 5057, a lever, and/or the like, can be applied. In a case where the touch panel is used as the input device 5047, the touch panel may be provided on a display surface of the display device 5041.

Alternatively, the input device 5047 is a device worn by the user, such as a glasses-type wearable device, a head mounted display (HMD), or the like, and various inputs are performed according to a gesture or a line-of-sight of the user detected by these devices. Furthermore, the input device 5047 includes a camera capable of detecting movement of the user, and various inputs are performed according to a gesture or a line-of-sight of the user detected from a video captured by the camera. Moreover, the input device 5047 includes a microphone capable of collecting a voice of the user, and various inputs are performed by the voice via the microphone. As described above, the input device 5047 is configured to be able to input various information in a non-contact manner, such that in particular, a user belonging to a clean area (for example, the operator 5067) can operate a device belonging to an unclean area in a non-contact manner. Furthermore, since the user can operate the device without releasing his/her hand from the surgical tool that he/she possesses, convenience for the user is improved.

A treatment tool control device 5049 controls the drive of the energy treatment tool 5021 for cautery and incision of tissue, sealing of a blood vessel, or the like. A pneumoperitoneum device 5051 sends a gas into the body cavity of the patient 5071 via the pneumoperitoneum tube 5019 in order to inflate the body cavity of the patient 5071 for the purpose of securing a visual field by the endoscope 5001 and securing a working space of the operator. A recorder 5053 is a device capable of recording various information regarding the surgery. A printer 5055 is a device capable of printing the various information regarding the surgery in various formats such as a text, an image, a graph, or the like.

Hereinafter, a particularly characteristic configuration of the endoscopic surgery system 5000 will be described in more detail.

(Support Arm Device)

The support arm device 5027 includes the base portion 5029, which is a base, and the arm portion 5031 extending from the base portion 5029. In the illustrated example, the arm portion 5031 includes a plurality of joint portions 5033a, 5033b, and 5033c and a plurality of links 5035a and 5035b connected to each other by the joint portion 5033b, but in FIG. 30, a configuration of the arm portion 5031 is illustrated in a simplified form for simplicity. Actually, shapes, the numbers, and arrangements of the joint portions 5033a to 5033c and the links 5035a and 5035b, directions of rotation axes of the joint portions 5033a to 5033c, and the like, can be appropriately set so that the arm portion 5031 has a desired degree of freedom. For example, the arm portion 5031 can preferably have six or more degrees of freedom. Therefore, it becomes possible to freely move the endoscope 5001 within a movable range of the arm portion 5031, and it becomes thus possible to insert the lens barrel 5003 of the endoscope 5001 into the body cavity of the patient 5071 from a desired direction.

The joint portions 5033a to 5033c are provided with actuators, and the joint portions 5033a to 5033c are configured to be rotatable around predetermined rotation axes by drive of the actuators. By controlling the drive of the actuators by the arm control device 5045, rotation angles of the joint portions 5033a to 5033c are controlled, such that the drive of the arm portion 5031 is controlled. Therefore, the control of the position and the posture of the endoscope 5001 can be realized. At this time, the arm control device 5045 can control the drive of the arm portion 5031 by various known control manners such as force control, position control, or the like.

For example, the operator 5067 appropriately performs an operation input via the input device 5047 (including the foot switch 5057) to allow the drive of the arm portion 5031 to be appropriately controlled by the arm control device 5045 according to the operation input, such that the position and the posture of the endoscope 5001 may be controlled. With this control, it is possible to move the endoscope 5001 of a tip of the arm portion 5031 from an arbitrary position to an arbitrary position and then fixedly support the endoscope 5001 at the position after the movement. Note that the arm portion 5031 may be operated in a so-called master slave manner. In this case, the arm portion 5031 can be remotely controlled by the user via the input device 5047 installed at a place spaced apart from the operating room.

Furthermore, in a case where the force control is applied, the arm control device 5045 may receive an external force from the user, and perform so-called power assist control to drive the actuators of each of the joint portions 5033a to 5033c so that the arm portion 5031 smoothly moves according to the external force. Therefore, when the user moves the arm portion 5031 while directly touching the arm portion 5031, he/she can move the arm portion 5031 with a relatively small force. Accordingly, it becomes possible to move the endoscope 5001 more intuitively and with a simpler operation, such that convenience of the user can be improved.

Here, generally, in the endoscopic surgery, the endoscope 5001 has been supported by a doctor called a scopist. On the other hand, by using the support arm device 5027, the position of the endoscope 5001 can be fixed more certainly without depending on manpower. Therefore, an image of the surgical site can be stably obtained, such that the surgery can be smoothly performed.

Note that the arm control device 5045 does not need to be necessarily provided in the cart 5037. Furthermore, the arm control device 5045 may not be necessarily one device. For example, the arm control device 5045 may be provided in each of the joint portions 5033a to 5033c of the arm portion 5031 of the support arm device 5027, and the drive control of the arm portion 5031 may be realized by cooperation between the plurality of arm control devices 5045.

(Light Source Device)

The light source device 5043 supplies irradiated light to the endoscope 5001 at the time of imaging the surgical site. The light source device 5043 includes, for example, a white light source including an LED, a laser light source, or a combination thereof. At this time, in a case where the white light source by a combination of RGB laser light sources is configured, it is possible to control an output intensity and an output timing of each color (each wavelength) with high accuracy, and it is thus possible to adjust a white balance of a captured image in the light source device 5043. Furthermore, in this case, by irradiating an observation target with laser light from each of the RGB laser light sources in a time division manner and controlling the drive of the imaging element of the camera head 5005 in synchronization with an irradiation timing of the laser light, it is also possible to capture images corresponding to each of RGB in a time division manner. According to such a method, it is possible to obtain a color image without providing a color filter to the imaging element.

Furthermore, the drive of the light source device 5043 may be controlled so as to change an intensity of light output by the light source device 5043 every predetermined time. By controlling the drive of the imaging element of the camera head 5005 in synchronization with a timing of the change in the intensity of the light to acquire images in a time division manner and synthesizing the images with each other, it is possible to generate a high dynamic range image without a so-called black spot and white spot.

Furthermore, the light source device 5043 may be configured to be able to supply light of a predetermined wavelength band corresponding to special light observation. In the special light observation, for example, so-called narrow band imaging in which a predetermined tissue such as a blood vessel or the like in a mucous membrane surface layer is imaged with high contrast by emitting light of a narrow band as compared with emitted light (that is, white light) at the time of normal observation using wavelength dependency of absorption of light in a body tissue is performed. Alternatively, in the special light observation, fluorescence observation in which an image is obtained by fluorescence generated by emitting excitation light may be performed. In the fluorescence observation, it can be performed to irradiate a body tissue with excitation light and observe fluorescence from the body tissue (self-fluorescence observation) or locally inject a reagent such as indocyanine green (ICG) or the like to the body tissue and irradiate the body tissue with excitation light corresponding to a fluorescence wavelength of the reagent to obtain a fluorescence image. The light source device 5043 can be configured to be able to supply the light of the narrow band and/or the excitation light corresponding to such special light observation.

(Camera Head and CCU)

Figure 31:
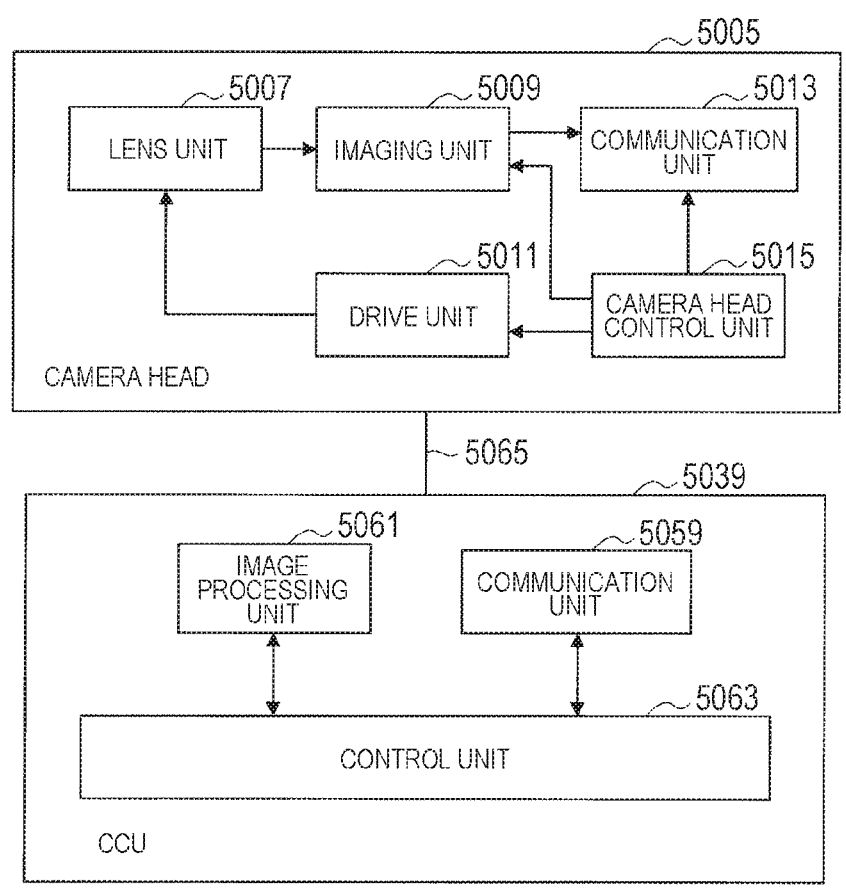
FIG. 31 is a block diagram illustrating an example of functional configurations of a camera head and a camera control unit (CCU) illustrated in FIG. 30.

Functions of the camera head 5005 of the endoscope 5001 and the CCU 5039 will be described in more detail with reference to FIG. 31. FIG. 31 is a block diagram illustrating an example of functional configurations of the camera head 5005 and the CCU 5039 illustrated in FIG. 30.

Referring to FIG. 31, the camera head 5005 includes a lens unit 5007, an imaging unit 5009, a drive unit 5011, a communication unit 5013, and a camera head control unit 5015 as its functions. Furthermore, the CCU 5039 includes a communication unit 5059, an image processing unit 5061, and a control unit 5063 as its functions. The camera head 5005 and the CCU 5039 are bi-directionally communicably connected to each other by a transmission cable 5065.

First, a functional configuration of the camera head 5005 will be described. The lens unit 5007 is an optical system provided at a connected portion with the lens barrel 5003. Observation light taken in from the tip of the lens barrel 5003 is guided to the camera head 5005 and is incident on the lens unit 5007. The lens unit 5007 is configured by combining a plurality of lenses including a zoom lens and a focus lens with each other. Optical characteristics of the lens unit 5007 are adjusted so that the observation light is condensed on a light receiving surface of the imaging element of the imaging unit 5009. Furthermore, the zoom lens and the focus lens are configured so that positions of the zoom lens and the focus lens on an optical axis are movable for adjusting a magnification and a focus of a captured image.

The imaging unit 5009 includes an imaging element, and is arranged at a subsequent stage of the lens unit 5007. The observation light that has passed through the lens unit 5007 is condensed on the light receiving surface of the imaging element, and an image signal corresponding to an observation image is generated by photoelectric conversion of the observation light. The image signal generated by the imaging unit 5009 is provided to the communication unit 5013.

As the imaging element configuring the imaging unit 5009, for example, an image element that is a complementary metal oxide semiconductor (CMOS)-type image sensor and has a Bayer array and can perform color imaging is used. Note that, as the imaging element, an imaging element capable of capturing an image having high resolution of, for example, 4K or more may be used. The image of the surgical site is obtained with high resolution, such that the operator 5067 can grasp the state of the surgical site in more detail and can thus perform the surgery more smoothly.

Furthermore, the imaging element configuring the imaging unit 5009 may include a pair of imaging elements for acquiring respectively image signals for a right eye and a left eye corresponding to a 3D display. By performing the 3D display, the operator 5067 can more accurately grasp a depth of a biological tissue in the surgical site. Note that in a case where the imaging unit 5009 is configured in the multi-plate type, a plurality of lens units 5007 is also provided to correspond to the respective imaging elements.

Furthermore, the imaging unit 5009 does not need to be necessarily provided in the camera head 5005. For example, the imaging unit 5009 may be provided immediately after the objective lens, inside the lens barrel 5003.

The drive unit 5011 includes an actuator, and moves the zoom lens and the focus lens of the lens unit 5007 by a predetermined distance along an optical axis under control of the camera head control unit 5015. Therefore, a magnification and a focus of the captured image by the imaging unit 5009 can be appropriately adjusted.

The communication unit 5013 includes a communication device for transmitting and receiving various information to and from the CCU 5039. The communication unit 5013 transmits the image signal obtained from the imaging unit 5009 as RAW data to the CCU 5039 via the transmission cable 5065. At this time, it is preferable that the image signal is transmitted by optical communication in order to display a captured image of the surgical site with low latency. This is because the operator 5067 performs the surgery while observing a state of the affected part by the captured image at the time of the surgery, and it is thus required that a moving image of the surgical site is displayed in real time as much as possible for safer and more certain surgery. In a case where the optical communication is performed, the communication unit 5013 is provided with a photoelectric conversion module converting an electric signal into an optical signal. After the image signal is converted into an optical signal by the photoelectric conversion module, the image signal is transmitted to the CCU 5039 via the transmission cable 5065.

Furthermore, the communication unit 5013 receives the control signal for controlling the drive of the camera head 5005 from the CCU 5039. The control signal includes, for example, information regarding imaging conditions such as information indicating that a frame rate of the captured image is designated, information indicating that an exposure value at the time of capturing the image is designated, information indicating that a magnification and a focus of the captured image are designated, and/or the like. The communication unit 5013 provides the received control signal to the camera head control unit 5015. Note that the control signal from the CCU 5039 may also be transmitted by the optical communication. In this case, the communication unit 5013 is provided with a photoelectric conversion module converting an optical signal into an electric signal, and the control signal is converted into an electric signal by the photoelectric conversion module and is then provided to the camera head control unit 5015.

Note that the imaging conditions such as the frame rate, the exposure value, the magnification, the focus, and the like, described above are automatically set by the control unit 5063 of the CCU 5039 on the basis of the acquired image signal. That is, a so-called auto exposure (AE) function, an auto focus (AF) function, and an auto white balance (AWB) function are mounted in the endoscope 5001.

The camera head control unit 5015 controls the drive of the camera head 5005 on the basis of the control signal from the CCU 5039 received via the communication unit 5013. For example, the camera head control unit 5015 controls the drive of the imaging element of the imaging unit 5009 on the basis of the information indicating that the frame rate of the captured image is designated and/or information indicating that exposure at the time of capturing the image is designated. Furthermore, for example, the camera head control unit 5015 appropriately moves the zoom lens and the focus lens of the lens unit 5007 via the drive unit 5011 on the basis of the information indicating that the magnification and the focus of the captured image are designated. The camera head control unit 5015 may further have a function of storing information for identifying the lens barrel 5003 or the camera head 5005.

Note that by arranging a configuration such as the lens unit 5007, the imaging unit 5009, or the like in a sealing structure having high airtightness and waterproofness, it is possible to cause the camera head 5005 to have resistance to autoclave sterilization.

Next, a functional configuration of the CCU 5039 will be described. The communication unit 5059 includes a communication device for transmitting and receiving various information to and from the camera head 5005. The communication unit 5059 receives the image signal transmitted from the camera head 5005 via the transmission cable 5065. At this time, as described above, the image signal can be preferably transmitted by the optical communication. In this case, the communication unit 5059 is provided with a photoelectric conversion module converting an optical signal into an electric signal so as to correspond to the optical communication. The communication unit 5059 provides the image signal converted into the electric signal to the image processing unit 5061.

Furthermore, the communication unit 5059 transmits the control signal for controlling the drive of the camera head 5005 to the camera head 5005. The control signal may also be transmitted by the optical communication.

The image processing unit 5061 performs various image processing on the image signal, which is the RAW data transmitted from the camera head 5005. The image processing includes, for example, various known signal processing such as development processing, image quality improvement processing (band emphasis processing, super-resolution processing, noise reduction (NR) processing, camera shake correction processing, and/or the like), enlargement processing (electronic zoom processing), and/or the like. Furthermore, the image processing unit 5061 performs detection processing on the image signal for performing AE, AF, and AWB.

The image processing unit 5061 includes a processor such as a CPU, a GPU, or the like, and the image processing or the detection processing described above can be performed by operating the processor according to a predetermined program. Note that in a case where the image processing unit 5061 includes a plurality of GPUs, the image processing unit 5061 appropriately divides information regarding the image signal, and performs image processing in parallel by the plurality of GPUs.

The control unit 5063 performs various controls related to the imaging of the surgical site by the endoscope 5001 and a display of the captured image. For example, the control unit 5063 generates the control signal for controlling the drive of the camera head 5005. At this time, in a case where the imaging condition is input by the user, the control unit 5063 generates the control signal on the basis of the input by the user. Alternatively, in a case where the endoscope 5001 has the AE function, the AF function, and the AWB function, the control unit 5063 appropriately calculates an optimal exposure value, focal length, and white balance according to a result of the detection processing by the image processing unit 5061 and generates the control signal.

Furthermore, the control unit 5063 causes the display device 5041 to display the image of the surgical site on the basis of the image signal on which the image processing is performed by the image processing unit 5061. At this time, the control unit 5063 recognizes various objects in the image of the surgical site using various image recognition technologies. For example, the control unit 5063 can recognize a surgical tool such as forceps or the like, a specific biological site, bleeding, mist at the time of using the energy treatment tool 5021, and the like, by detecting a shape, a color, or the like of an edge of an object included in the image of the surgical site. The control unit 5063 causes various surgical support information to be superimposed and displayed on the image of the surgical site using a result of the recognition, when the control unit 5063 causes the display device 5041 to display the image of the surgical site. The surgical support information is superimposed and displayed and is provided to the operator 5067, such that it becomes possible to more safely and certainly perform the surgery.

The transmission cable 5065 connecting the camera head 5005 and the CCU 5039 to each other is an electric signal cable corresponding to communication of an electric signal, an optical fiber corresponding to optical communication, or a composite cable of the electric signal cable and the optical fiber.

Here, communication has been performed in a wired manner using the transmission cable 5065 in the illustrated example, but communication between the camera head 5005 and the CCU 5039 may be performed in a wireless manner. In a case where the communication between the camera head 5005 and the CCU 5039 is performed in the wireless manner, it is not necessary to lay the transmission cable 5065 in the operating room, and a situation where movement of medical staff in the operating room is hindered by the transmission cable 5065 can thus be solved.

An example of the endoscopic surgery system 5000 to which the technology according to the present disclosure can be applied has been described hereinabove. Note that the endoscopic surgery system 5000 has been described as an example here, but a system to which the technology according to the present disclosure can be applied is not limited to such an example. For example, the technology according to the present disclosure may be applied to a flexible endoscopic system for examination or a microsurgery system.

The technology according to the present disclosure can be applied to the imaging unit 5009 and the image processing unit 5061 among the configurations described above. Specifically, the solid-state imaging element 200 of FIG. 2 can be applied to the imaging unit 5009, and the signal processing unit 120 of FIG. 1 can be applied to the image processing unit 5061. By applying the technology according to the present disclosure to the imaging unit 5009 and the image processing unit 5061, it is possible to improve recognition accuracy of a living body using the spectral spectrum, and it becomes thus possible to more safely and reliably perform the surgery.

Note that the embodiment described above is an example for embodying the present technology, and the matters in the embodiments and the matters specifying the invention in the claims have a corresponding relationship therebetween. Similarly, the matters specifying the invention in the claims and the matters having the same names in the embodiments of the present technology have a correspondence relationship therebetween. However, the present technology is not limited to the embodiments, and can be embodied by variously modifying the embodiments without departing from the gist of the present technology.

Note that the present technology can also adopt the following configuration.

(1) A solid-state imaging element including:
a surface layer that has a thickness exceeding a half of a coherence length of incident light;
a filter layer that transmits predetermined target light of the incident light transmitted through the surface layer and reflects a rest of the incident light transmitted through the surface layer to the surface layer; and
a photoelectric conversion layer that photoelectrically converts the predetermined target light transmitted through the filter layer.

(2) The solid-state imaging element according to the above (1), in which
the surface layer includes an antireflection film.

(3) The solid-state imaging element according to the above (2), in which
the surface layer further includes a silicon dioxide layer.

(4) The solid-state imaging element according to the above (2), in which
the surface layer further includes a transparent resin layer.

(5) The solid-state imaging element according to the above (4), in which
the surface layer further includes a stress relaxation resin layer.

(6) The solid-state imaging element according to any one of the above (1) to (5), in which
the filter layer includes a surface plasmon resonance filter.

(7) The solid-state imaging element according to any one of the above (1) to (5), in which
the filter layer includes a Fabry-Perot resonator.

(8) The solid-state imaging element according to any one of the above (1) to (7), in which
the incident light includes natural light, and
the thickness of the surface layer is not less than 2.0 micrometers.

(9) An electronic device including:
a surface layer that has a thickness exceeding a half of a coherence length of incident light;
a filter layer that transmits predetermined target light of the incident light transmitted through the surface layer and reflects a rest of the incident light transmitted through the surface layer to the surface layer;
a photoelectric conversion layer that photoelectrically converts the predetermined target light transmitted through the filter layer to generate a pixel signal; and
a signal processing unit that executes predetermined signal processing for the pixel signal.

(10) The electronic device according to the above (9), further including
a cover glass,
in which the incident light is incident on the surface layer via the cover glass and a predetermined gas.

(11) The electronic device according to the above (9) or (10), in which
the signal processing unit obtains a normalized difference vegetation index in the signal processing.

(12) The electronic device according to the above (9) or (10), in which
the signal processing unit performs biometric authentication in the signal processing.

(13) A method of manufacturing an electronic device, including:
a first etching procedure of exposing a part of a photoelectric conversion layer by etching for a solid-state imaging element, the solid-state imaging element including: a surface layer that has a thickness exceeding a half of a coherence length of incident light, a filter layer that transmits predetermined target light of the incident light transmitted through the surface layer and reflects a rest of the incident light transmitted through the surface layer to the surface layer, the photoelectric conversion layer that photoelectrically converts the predetermined target light transmitted through the filter layer, and a pad;
a second etching procedure of exposing the pad by opening the part by etching; and
a connecting procedure of connecting the exposed pad and a support substrate to each other by a wire.

REFERENCE SIGNS LIST

100 Electronic device
110 Camera module
111 Cover glass
113 Support substrate
120, 121, 122 Signal processing unit
130 Display unit
200, 201 Solid-state imaging element
210 Vertical drive unit
220 Pixel array unit
221 Pixel block
230 Timing control unit
240 Column signal processing unit
250 Horizontal drive unit
300 Pixel
310 Surface layer
311, 324, 331, 353 Silicon dioxide layer
312, 333 Antireflection film
313 Transparent resin layer
314 Stress relaxation resin layer
320 Filter layer
321, 323 Silicon oxynitride layer
322 Silicon nitride layer
332 Light shielding film
334 Photoelectric conversion layer
340 Surface plasmon resonance filter
350 Fabry-Perot resonator
351, 355 Half mirror
352 Titanium oxide layer
354 Resonator
410 Wiring layer
5009 Imaging unit
5061 Image processing unit

The invention claimed is:

1. A solid-state imaging element, comprising:
a surface layer that has a thickness exceeding a half of a coherence length of incident light, wherein
the surface layer includes an antireflection film, a transparent resin layer, and a stress relaxation layer, and
the transparent resin layer is between the antireflection film and the stress relaxation layer;
a filter layer configured to transmit a first part of the incident light transmitted through the surface layer and reflect a second part of the incident light transmitted through the surface layer to the surface layer, wherein the second part of the incident light transmitted through the surface layer is different from the first part of the incident light transmitted through the surface layer; and
a photoelectric conversion layer configured to photoelectrically convert the first part of the incident light transmitted through the filter layer.

2. The solid-state imaging element according to claim 1, wherein the filter layer includes a surface plasmon resonance filter.

3. The solid-state imaging element according to claim 1, wherein the filter layer includes a Fabry-Perot resonator.

4. The solid-state imaging element according to claim 1, wherein
the incident light includes natural light, and
the thickness of the surface layer is not less than 2.0 micrometers.

5. An electronic device comprising:
a surface layer that has a thickness exceeding a half of a coherence length of incident light, wherein
the surface layer includes an antireflection film, a transparent resin layer, and a stress relaxation layer, and
the transparent resin layer is between the antireflection film and the stress relaxation layer;
a filter layer configured to transmit a first portion of the incident light transmitted through the surface layer and reflect a second portion of the incident light transmitted through the surface layer to the surface layer, wherein the second portion of the incident light transmitted through the surface layer is different from the first portion of the incident light transmitted through the surface layer;
a photoelectric conversion layer configured to photoelectrically convert the first portion of the incident light transmitted through the filter layer to generate a pixel signal; and
a signal processing unit configured to execute a signal processing operation for the pixel signal.

6. The electronic device according to claim 5, further comprising a cover glass, wherein the incident light is incident on the surface layer via the cover glass and a gas.

7. The electronic device according to claim 5, wherein the signal processing unit is further configured to obtain a normalized difference vegetation index in the signal processing operation.

8. The electronic device according to claim 5, wherein the signal processing unit is further configured to perform biometric authentication in the signal processing operation.

9. A method of manufacturing an electronic device, comprising:
a first etching procedure of exposing a part of a photoelectric conversion layer by etching for a solid-state imaging element, the solid-state imaging element including:
a surface layer that has a thickness exceeding a half of a coherence length of incident light, wherein
the surface layer includes an antireflection film, a transparent resin layer, and a stress relaxation layer, and
the transparent resin layer is between the antireflection film and the stress relaxation layer,
a filter layer configured to transmit a first part of the incident light transmitted through the surface layer and reflect a second part of the incident light transmitted through the surface layer to the surface layer, wherein the second part of the incident light transmitted through the surface layer is different from the first part of the incident light transmitted through the surface layer, and
the photoelectric conversion layer configured to photoelectrically convert the first part of the incident light transmitted through the filter layer, and
a pad;
a second etching procedure of exposing the pad by opening the part of the photoelectric conversion layer by etching; and
a connecting procedure of connecting the exposed pad to a support substrate by a wire.

* * * * *